(12) United States Patent
Mishima et al.

(10) Patent No.: US 8,186,301 B2
(45) Date of Patent: May 29, 2012

(54) APPARATUS FOR MANUFACTURING GAS BARRIER PLASTIC CONTAINER, METHOD FOR MANUFACTURING THE CONTAINER, AND THE CONTAINER

(75) Inventors: Akio Mishima, Tokyo (JP); Masaki Nakaya, Tokyo (JP); Akira Shirakura, Tokyo (JP)

(73) Assignee: Kirin Beer Kabushiki Kaisha, Tokyo (JP)

( * ) Notice: Subject to any disclaimer, the term of this patent is extended or adjusted under 35 U.S.C. 154(b) by 1030 days.

(21) Appl. No.: 11/912,345

(22) PCT Filed: May 26, 2006

(86) PCT No.: PCT/JP2006/310562
§ 371 (c)(1),
(2), (4) Date: Nov. 20, 2007

(87) PCT Pub. No.: WO2006/126677
PCT Pub. Date: Nov. 30, 2006

(65) Prior Publication Data
US 2009/0061111 A1 Mar. 5, 2009

(30) Foreign Application Priority Data

May 27, 2005 (JP) ................... 2005-156418

(51) Int. Cl.
*C23C 16/00* (2006.01)
(52) U.S. Cl. .................... 118/723 E; 118/724
(58) Field of Classification Search .......... 118/724, 118/723 E
See application file for complete search history.

(56) References Cited

U.S. PATENT DOCUMENTS 4,045,211 A * 8/1977 Powers ............... 75/645
(Continued)

FOREIGN PATENT DOCUMENTS

EP 1 258 234 A1 11/2002
(Continued)

OTHER PUBLICATIONS

English translation JP 2003-341673, Yamazaki, Mar. 2003.*
(Continued)

*Primary Examiner* — Keath Chen
(74) *Attorney, Agent, or Firm* — Sughrue Mion, PLLC

(57) ABSTRACT

The object of the present invention is to provide an apparatus for manufacturing a gas barrier plastic container which simultaneously satisfies the condition that the same vacuum chamber can be used even when the container shapes are different, the condition that a high-frequency power source is unnecessary, and the condition that film formation can be carried out for a plurality of containers inside one vacuum chamber in order to make the apparatus low cost. In an apparatus for forming a film on the inner surface of a container, a thermal catalyst is supported on a source gas supply pipe, and the source gas supply pipe is inserted into the port of the container, followed by film formation. In an apparatus for forming a film on the outer surface of a container, a thermal catalyst is arranged on the periphery of the plastic, and a source gas is blown out through the source gas supply pipe while bringing the source gas into contact with the thermal catalyst for film formation. Cooling is carried out to avoid the thermal deformation of the container by heat radiated from the thermal catalyst. For example, a container on which a hydrogen-containing $SiN_x$ thin film having a film thickness of 5 to 100 nm and a hydrogen content ratio of 1 to 10 atomic % has been obtained.

8 Claims, 9 Drawing Sheets

U.S. PATENT DOCUMENTS

| | | | | |
|---|---|---|---|---|
| 4,284,867 | A * | 8/1981 | Hill et al. | 219/634 |
| 4,478,889 | A * | 10/1984 | Maruhashi et al. | 427/230 |
| 4,753,856 | A * | 6/1988 | Haluska et al. | 428/698 |
| 5,470,800 | A | 11/1995 | Muroyama | 438/789 |
| 6,174,159 | B1 * | 1/2001 | Smith et al. | 431/7 |
| 6,403,410 | B1 * | 6/2002 | Ohira et al. | 438/181 |
| 6,653,212 | B1 * | 11/2003 | Yamanaka et al. | 438/485 |
| 2004/0050744 | A1 | 3/2004 | Hama et al. | |
| 2005/0229851 | A1 | 10/2005 | Hama et al. | |
| 2007/0037346 | A1 * | 2/2007 | Grant | 438/243 |
| 2007/0157885 | A1 * | 7/2007 | Yamasaki | 118/723 E |
| 2010/0328898 | A1 * | 12/2010 | Kabir | 361/713 |

FOREIGN PATENT DOCUMENTS

| | | |
|---|---|---|
| EP | 1 493 839 A1 | 1/2005 |
| EP | 1 533 835 A1 | 5/2005 |
| JP | 60-251027 A | 12/1985 |
| JP | 62-7060 B2 | 2/1987 |
| JP | 05-185495 A | 7/1993 |
| JP | 2788412 B2 | 6/1998 |
| JP | 2001-097342 A | 4/2001 |
| JP | 2003-341673 * | 3/2003 |
| JP | 2003-267378 A | 9/2003 |
| JP | 2004-107689 A | 4/2004 |
| JP | 2004-211160 A | 7/2004 |
| JP | 2004-277757 A | 10/2004 |
| JP | 2004-345646 A | 12/2004 |
| JP | 2005-022727 A | 1/2005 |
| JP | 2005-068471 A | 3/2005 |
| JP | 2005-089814 A | 4/2005 |
| WO | 00/63456 A2 | 10/2000 |
| WO | 03/006181 A1 | 1/2003 |
| WO | 03/100840 A1 | 12/2003 |

OTHER PUBLICATIONS

Supplemental European Search Report dated Mar. 29, 2010, issued in corresponding Application No. 06746891.8.

* cited by examiner

FIG. 11(a)
FIG. 11(b)
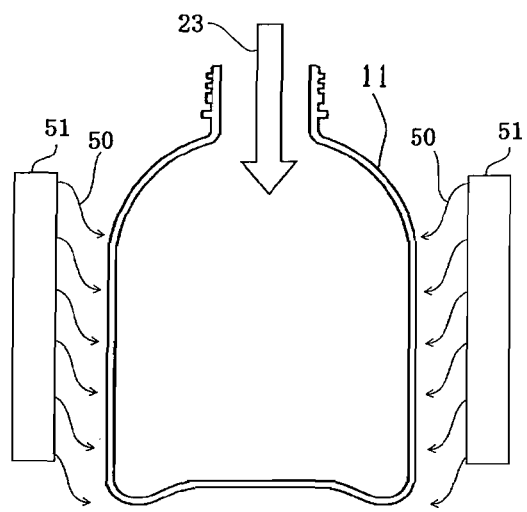
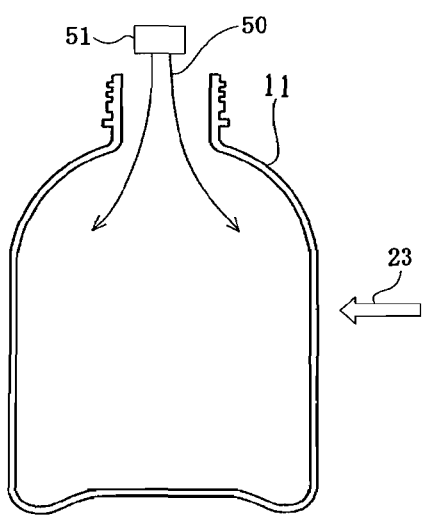
FIG. 12
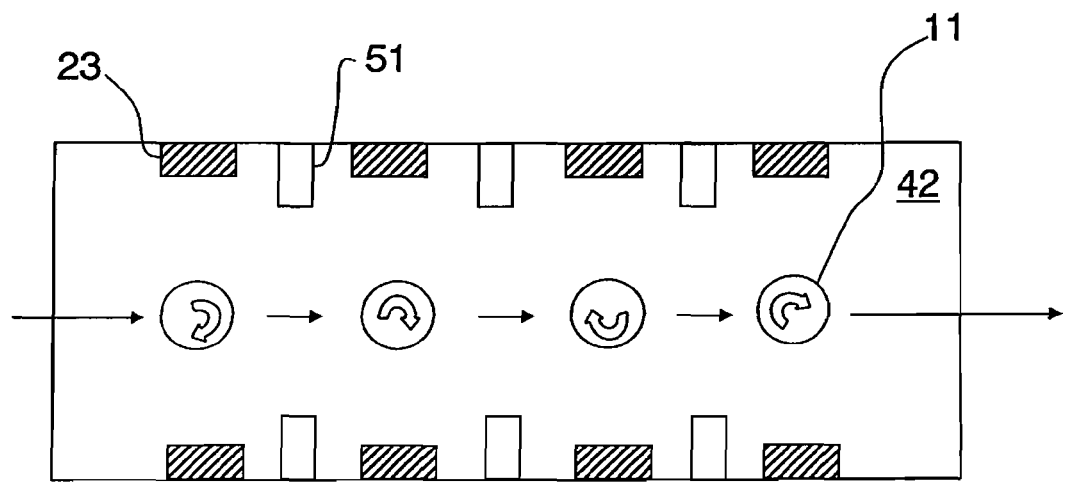

APPARATUS FOR MANUFACTURING GAS BARRIER PLASTIC CONTAINER, METHOD FOR MANUFACTURING THE CONTAINER, AND THE CONTAINER

CROSS REFERENCE TO PRIOR APPLICATION

This is a U.S. National Phase application under 35 U.S.C. §371 of International Patent Application No. PCT/JP2006/310562 filed May 26, 2006, which claims the benefit of Japanese Application No. 2005-156418, filed May 27, 2005 all of which are incorporated by reference herein. The International Application was published in Japanese on Nov. 30, 2006, as WO 2006/126677 A1 under PCT Article 21(2).

TECHNOLOGICAL FIELD

The present invention is related to a beverage plastic container having oxygen gas and carbon dioxide gas barrier properties which is suited to being filled, for example, with contents such as alcoholic beverages such as beer and the like that are sensitive to oxidation from the view of quality and require there to be a limited release of carbon dioxide gas from the container wall, or soft drinks which are sensitive to oxidation in the same way, and in particular is related to a plastic container having a gas barrier thin film formed by a catalytic chemical vapor deposition method on at least one of the outer surface and inner surface as an oxygen gas and carbon dioxide gas barrier layer, which is low cost and light weight, and which has superior shock resistance and recyclability, and a manufacturing method and manufacturing apparatus therefor.

PRIOR ART TECHNOLOGY

Beer has been habitually consumed since ancient times in Europe, and in recent years has been consumed in large quantities as the alcoholic beverage of the masses all over the world. In recent years, beer is brewed in large quantities in beer factories, and after being filled into small-sized containers, is transported to consumer areas, stored, and sold. This kind of beer not only requires aroma to be preserved during transportation and storage, but because it is oxidized easily and contains carbon dioxide is used in containers of little gas permeation such as glass bottles, aluminum cans and the like up to now.

Aluminum cans are light in weight, have a superior recyclability, gas barrier properties, shock resistance and light-blocking properties, and have advantages such as being beautiful and the like. Accordingly, they are believed to be very ideal containers as a packaging material for contents that are oxidized easily as well as are not oxidized, and recently usage as beer containers has increased to occupy the mainstream. On the other hand, the raw material is expensive, the manufacturing equipment such as equipment for aluminum cans and filling equipment for contents needs to be large scale and high performance, a very large scale investment is required, and this can only correspond to products of low-mix mass production. Moreover, the aluminum material requires a corrosion resistance treatment, the product cost is expensive, and it is difficult to make large-sized containers. Furthermore, the viewing of contents is also one important concept for containers at food markets, but contents are not visible through them. From the above reasons, aluminum cans are normally mainly used as small-sized containers of one liter or less which are impossible to reseal.

Glass bottles which have come to be used on the most massive scale up to now have a superior recyclability, gas barrier properties, corrosion resistance and resealability, can correspond also to high-mix low-volume production, and have the advantage that production can be carried out with the product cost being relatively cheap. However, compared to plastic containers such as polyethylene terephthalate (hereafter referred to as "PET") bottles and the like or aluminum cans, they have serious disadvantages such as the container weight being heavy and the shock resistance being very weak. As counter measures for this, counter measures such as designing the bottle wall to be made thin to lighten the weight are being taken, but because there is a limit, the effect thereof is trivial. Accordingly, this market is in the process of switching gradually to aluminum cans and PET bottles.

Further, plastic containers are transparent and light in weight, have a superior shock resistance and a corrosion resistance, have a cheap product cost, need only a small equipment investment, and form a superior packaging material capable of corresponding to high-mix low-volume production. However, the gas barrier properties are low which is a problem that doesn't exist at all in aluminum cans and glass bottles. Namely, plastic containers have serious disadvantages in that the gas barrier properties for oxygen gas and carbon dioxide gas and the like are low as containers of contents that are sensitive to oxidation from the view of quality and are sensitive to the escape of carbon dioxide gas, for example, contents such as beer and the like. Measures to improve the gas barrier properties of these kinds of plastic containers have been proposed in great numbers in which a structural material resin layer and a gas barrier property resin layer are laminated to make a multilayer plastic container having improved gas barrier properties.

As for prior art methods of manufacturing a multilayer plastic container, there is a great number of proposals such as (1) a direct blow formation method (e.g., see Patent Document 1) in which a parison is formed by extruding a thermoplastic plastic (structural resin) such as PET or polypropylene (hereafter referred to as "PP") or the like and a gas barrier property resin such as a saponified material (ethylene-vinyl alcohol copolymer; hereafter referred to as "EVOH") of ethylene-vinyl acetate copolymer, polyamide, polyvinylidene chloride, polyacrylonitrile or the like with such gas barrier property resin forming an intermediate layer, and then this undergoes blow forming, (2) a method which applies a gas barrier resin such as EVOH or the like to the surface of a plastic container after it is formed (e.g., see Patent Document 2), (3) and because the gas barrier properties are lowered when the EVOH applied as described above absorbs moisture, in order to prevent this, a method in which the surface of such gas barrier property resin, namely, the surface of the container is covered using a shrink film coated with a hydrophobic resin (e.g., see Patent Document 3), and the like. Further, a stretch blown multilayer plastic container capable of maintaining high product strength even for thin walls is anticipated to be the most developed method (e.g., see Patent Document 4). However, even in this method, compared to the prior art single-layer plastic container for soft drinks, the multilayer plastic container has problems with productivity (formation cycle), molding machine cost, costs such as maintenance of molding machine and metal molds and the like, and has a problem with recyclability. From these kinds of reasons, there has been a desire for a highly functional thin film coated single-layer PET bottle which can use the molding machine for PET bottles in general use, and which satisfies the required performance as a beer container.

In recent years, a DLC (Diamond Like Carbon) film has come to be put to practical use as a single-layer thin film coated on PET bottles. This DLC film is a film formed from an amorphous three-dimensional structure by carbon atoms and hydrogen atoms, is hard, has superior insulating properties, has a high refractive index, and is a hard carbon film having a very smooth morphology.

In the prior art, there are examples where this kind of DLC film forming technology has been applied to plastic containers (e.g., see Patent Document 5). The apparatus for forming a general DLC film described in Patent Document 5 is as follows. Namely, as shown in FIG. 9, a plastic container 5 is housed inside an outer electrode 2 arranged inside a reaction chamber 1 which has a carbon source gas introduction port 1A and an exhaust port 1B. Further, after a carbon source gas is introduced from the introduction port 1A, a DLC is formed on the inner surface of the plastic container 5 by applying a high frequency power with a high-frequency power supply 4 between an inner electrode 3 and the outer electrode 2 to excite the carbon source gas and generate plasma.

Patent Document 1: Japanese Laid-Open Patent Application No. HEI 5-185495
Patent Document 2: Japanese Laid-Open Patent Application No. SHO 60-251027
Patent Document 3: Japanese Patent Publication No. SHO 62-7060
Patent Document 4: Japanese Laid-Open Patent Application No. 2001-97342
Patent Document 5: Japanese Patent No. 2788412

SUMMARY OF THE INVENTION

Problems to be Solved by the Invention

However, the apparatus for forming a DLC film described above invariably requires the high-frequency power supply 4 and a high-frequency power matching device (number not shown) from the fact that the carbon source gas is decomposed by plasma and ionized, and then the ions accelerated by an electric field collide with the inner surface of the plastic container to form a thin film, and therefore has the problem that the cost of the apparatus increases.

Furthermore, in the apparatus for forming a DLC film described above, the outer electrode 2 and the inner electrode 3 are invariably required, the reaction chamber 1 formed from the outer electrode 2 and the inner electrode 3 is required for one plastic container, and the outer electrode 2 must be made to correspond to each container shape, and this leads to an increased cost of the DLC film forming apparatus.

Further, with the DLC film forming apparatus described above, when forming a thin film, the plasma will damage the thin film surface, the fineness of the thin film is easily ruined, and the content ratio of hydrogen which causes lowering of the gas barrier properties of the DLC film is large, and this making it difficult to obtain gas barrier properties higher than 15~20 times.

In this regard, the present invention was developed to solve the problems of the prior art described above. Namely, in an apparatus for manufacturing a gas barrier plastic container, it is an object of the present invention to satisfy the condition that it is possible to use the same vacuum chamber even when the container shapes are different, the condition that a high-frequency power source is unnecessary, and the condition that film formation can be carried out for a plurality of containers inside one vacuum chamber in order to make the apparatus low cost. In this regard, it is an object to provide a manufacturing apparatus which can form a gas barrier thin film on the inner surface of a plastic container, and a manufacturing apparatus which can form a gas barrier thin film on the outer surface of a plastic container. Further, in a method of manufacturing a gas barrier plastic container, it is an object of the present invention to form a gas barrier thin film that is not damaged by plasma on at least one of either the inner surface or the outer surface of a plastic container. Furthermore, in a gas barrier plastic container, it is an object of the present invention to impart both durability which makes it difficult for cracks to occur even when there is deformation or shrinkage of the container and gas barrier properties for oxygen gas and carbon dioxide gas by forming a hydrogen-containing $SiN_x$ thin film, a hydrogen-containing DLC thin film, a hydrogen-containing $SiO_x$ thin film or a hydrogen-containing $SiC_xN_y$ thin film at a pre-set film thickness and a pre-set hydrogen concentration that is not damaged by plasma on at least one of either the inner surface or the outer surface of a plastic container.

Means for Solving the Problems

The present inventors discovered that it is possible to solve the problems described above by using a catalytic chemical vapor deposition method when forming a gas barrier thin film on the wall surface of a plastic container, and completed the present invention. Namely, the first apparatus for manufacturing a gas barrier plastic container according to the present invention comprises a vacuum chamber for housing a plastic container, an exhaust pump which evacuates said vacuum chamber, a source gas supply pipe formed from an insulating and heat-resistant material which is arranged to be insertable into and removable from the inside of said plastic container to supply a source gas to the inside of said plastic container, a thermal catalyst which is supported on said source gas supply pipe, and a heater power supply which supplies electricity to said thermal catalyst to generate heat. The present manufacturing apparatus is an apparatus for manufacturing a gas barrier plastic container in which a gas barrier thin film is formed on the inner surface of the container.

In the first apparatus for manufacturing a gas barrier plastic container according to the present invention, preferably said source gas supply pipe has an integrally formed cooling pipe for cooling said source gas supply pipe. Because the temperature of the source gas supply pipe rises due to the heat generated by the thermal catalyst, by cooling this, it is possible to reduce to the thermal effects inflicted on the plastic container.

In the first apparatus for manufacturing a gas barrier plastic container according to the present invention, preferably said source gas supply pipe is a ceramic pipe formed from a material in which aluminum nitride, silicon carbide, silicon nitride or aluminum oxide forms the main component, or a metal pipe whose surface is coated with a material in which aluminum nitride, silicon carbide, silicon nitride or aluminum oxide forms the main component. This makes it possible to supply electricity in a stable manner to the thermal catalyst, has durability, and makes it possible to exhaust heat efficiently by thermal conduction of the heat generated by the thermal catalyst.

In the first apparatus for manufacturing a gas barrier plastic container according to the present invention, preferably said source gas supply pipe has a gas blow out hole in the tip of the pipe, and the distance from said gas blow out hole to the bottom of said plastic container has a length of 5~30 mm. This improves the uniformity of the film thickness.

In the first apparatus for manufacturing a gas barrier plastic container according to the present invention, preferably said thermal catalyst is arranged so that the upper end thereof is positioned 10–30 mm below from the lower end of the mouth portion of said plastic container. This makes it possible to control deformation of the shoulder portion of the plastic container.

In the first apparatus for manufacturing a gas barrier plastic container according to the present invention, preferably the inner surface of said vacuum chamber is colored black or the inner surface has a surface roughness (Rmax) of 0.5 μm or higher, and cooling means are provided in the inside or the outside of the chamber. By controlling the reflection of emission light generated by the thermal catalyst, it is possible to reduce the thermal effects inflicted on the plastic container.

The first apparatus for manufacturing a gas barrier plastic container according to the present invention preferably has container cooling means which apply a cooled liquid or gas to the outer surface of said plastic container. This makes it possible to reduce the thermal effects inflicted on the plastic container.

The second apparatus for manufacturing a gas barrier plastic container according to the present invention comprises a vacuum chamber for housing a plastic container, an exhaust pump which evacuates said vacuum chamber, a thermal catalyst arranged on the periphery of said plastic container, a source gas supply pipe which supplies a source gas in the space outside said plastic container in the inside of said vacuum chamber, and a heater power supply which supplies electricity to said thermal catalyst to generate heat. The present manufacturing apparatus is an apparatus for manufacturing a gas barrier plastic container in which a gas barrier thin film is formed on the outer surface of the container.

In the second apparatus for manufacturing a gas barrier plastic container according to the present invention, preferably said thermal catalyst is arranged in a plural manner at rotationally symmetric positions with respect to the principal axis of said plastic container, or is arranged to be wound in a spiral shape with the principle axis of said plastic container at the center, or is arranged to be wound respectively parallel on a plurality of cross sections of the principle axis of said plastic container. This improves the uniformity of the film thickness.

In the second apparatus for manufacturing a gas barrier plastic container according to the present invention, preferably said thermal catalysts are arranged to be mutually separated 5 cm or more. This makes it easy to obtain high production efficiency for chemical species and uniformity of the film thickness without inflicting thermal damage on the plastic container.

In the second apparatus for manufacturing a gas barrier plastic container according to the present invention, preferably said thermal catalyst is arranged so that the distance to the outer surface of the plastic container is fixed. This improves the uniformity of the film thickness on the outer surface including the bottom of the container.

The second apparatus for manufacturing a gas barrier plastic container according to the present invention preferably has container cooling means which apply a cooled liquid or gas to the inner surface of said plastic container. This makes it possible to reduce the thermal effects inflicted on the plastic container.

In the first or second apparatus for manufacturing a gas barrier plastic container according to the present invention, preferably said thermal catalyst is arranged at least at the exit side of the gas blow out hole of said source gas supply pipe. This makes it possible to efficiently activate the source gas by the thermal catalyst.

In the first or second apparatus for manufacturing a gas barrier plastic container according to the present invention, preferably said source gas supply pipe is provided with a housing mechanism for housing said thermal catalyst inside. For example, there are cases where chemical reactions occur between the thermal catalyst and one portion of the source gas at the time when there is no film formation, and in the case where this kind of source gas is used, it is possible to extend the life of the thermal catalyst.

In the first or second apparatus for manufacturing a gas barrier plastic container according to the present invention, preferably said thermal catalyst is arranged inside said source gas supply pipe. Because the distance between the thermal catalyst and the surface of the plastic container can be made larger, it is possible to reduce the thermal effects inflicted on the plastic container.

In the first or second apparatus for manufacturing a gas barrier plastic container according to the present invention, preferably said thermal catalyst has a portion in which a wire is processed to form a coil spring shape, a wavy line shape or a zigzag line shape. This makes it possible to increase the opportunity for contact between the source gas and the thermal catalyst, and as a result, the reaction efficiency rises.

In the first or second apparatus for manufacturing a gas barrier plastic container according to the present invention, preferably said thermal catalyst is arranged along the blow out direction of said source gas. This makes it possible to increase the opportunity for contact between the source gas and the thermal catalyst, and as a result, the reaction efficiency rises.

The first method of manufacturing a gas barrier plastic container according to the present invention comprises a process in which the inside of a vacuum chamber which houses a plastic container is exhausted to form a pre-set pressure, and a process in which while maintaining a state where electricity is supplied to a thermal catalyst arranged inside said vacuum chamber to generate heat above a pre-set temperature, a source gas is blown on said thermal catalyst to decompose said source gas and create chemical species, whereby a gas barrier thin film is formed by said chemical species reaching at least one of either the inner surface or the outer surface of said plastic container. The present manufacturing method is a method of manufacturing a gas barrier plastic container in which a gas barrier thin film is formed on the inner surface of the container.

In the first method of manufacturing a gas barrier plastic container according to the present invention, preferably the blowing of said source gas is begun after the temperature rise of said thermal catalyst above the pre-set temperature is completed. Said pre-set temperature is determined in accordance with the combination of the catalyst and the source gas, and in accordance with the characteristics of the formed thin film, but in the case where film formation is carried out using a tungsten catalyst and a silicon gas, for example, the temperature of the tungsten catalyst is set at 1600° C. or higher. From the beginning of film formation, it is possible to create chemical species sufficiently activated by the thermal catalyst, and this makes it easy to obtain a film having high gas barrier properties.

The second method of manufacturing a gas barrier plastic container according to the present invention comprises a process in which after at least one of the spaces inside or outside a plastic container housed in a reaction chamber is filled with a source gas under a pre-set pressure, the supply of said source gas is stopped to stop the flowing in and out of gas in said reaction chamber, and a process in which while maintaining a state where electricity is supplied to a thermal catalyst to generate heat above a pre-set temperature, said thermal catalyst is guided into the space filled with said source gas to decompose said source gas and create chemical species, whereby a gas barrier thin film is formed by said chemical species reaching at least one of either the inner surface or the outer surface of said plastic container. The present manufacturing method is a method of manufacturing a gas barrier plastic container in which a gas barrier thin film is formed on the outer surface of the container.

In the gas barrier plastic container according to the present invention, a hydrogen-containing $SiN_x$ thin film, a hydrogen-containing DLC thin film, a hydrogen-containing $SiO_x$ thin film or a hydrogen-containing $SiC_xN_y$ thin film is formed as a gas barrier thin film on at least one of the inner surface or the outer surface of a plastic container, and said hydrogen-containing $SiN_x$ thin film, said hydrogen-containing DLC thin film, said hydrogen-containing $SiO_x$ thin film or said hydrogen-containing $SiC_xN_y$ thin film has a film thickness of 5~100 nm and a hydrogen content ratio of 1~10 atomic %.

EFFECT OF THE INVENTION

In the apparatus for manufacturing a gas barrier plastic container, the present invention satisfies the condition that it is possible to use the same vacuum chamber even when the container shapes are different, the condition that a high-frequency power source is unnecessary, and the condition that film formation can be carried out for a plurality of containers inside one vacuum chamber in order to make the apparatus low cost. In this regard, it is possible to form a gas barrier thin film on the inner surface or the outer surface of the plastic container. Further, in the method of manufacturing a gas barrier plastic container, the present invention makes it possible to form a gas barrier thin film that is not damaged by plasma on at least one of either the inner surface or the outer surface of the plastic container. Furthermore, in the gas barrier plastic container, the present invention makes it possible to impart both durability which makes it difficult for cracks to occur even when there is deformation or shrinkage of the container and gas barrier properties for oxygen gas and carbon dioxide gas.

BRIEF DESCRIPTION OF THE DRAWINGS

FIG. 11 is a conceptual drawing for describing the container cooling means, wherein (a) is the case where film formation is carried out on the inner surface of the plastic container, and (b) is the case where film formation is carried out on the outer surface of the plastic container.

FIG. 12 shows another embodiment of the thin film formation chamber of FIG. 8.

DESCRIPTION OF SYMBOLS 1, 12, Reaction Chamber
1A, Carbon Source Gas Introduction Port
1B, Exhaust Port
2, Outer Electrode
3, Inner Electrode
4, High-Frequency Power Supply
5, 11, Plastic Container
6, 60, Vacuum Chamber
8, Vacuum Valve
13, 63, Lower Chamber
14, O-ring
15, 65, Upper Chamber
16, 16a, 16b, 66, Gas Supply Port
17, 17a, 17b, Source Gas Channel
17x, 77x, Gas Blow Out Hole
18, Thermal Catalyst
19, Wiring
20, Heater Power Supply
21, Mouth Portion of Plastic Container
22, Exhaust Pipe
23, 73, Source Gas Supply Pipe
24a, 24b, 24c, Flow Controller
25a, 25b, 25c, 25d, 25e, 25f, Valve
26a, 26b, 79a, 79b, Connecting Portion
27, Cooling Water Channel
28, Inner Surface of Vacuum Chamber
29, Cooling Means
30, Chamber made from Transparent Body
31, Source Gas Pipeline
32, Bottle Rotation Mechanism
33, 33a, 33b, Source Gas
34, Chemical Species
35, Insulating Ceramic Member
36, Insulating Ceramic Inner Pipe Equipped with Telescopic
35, Mechanism
40, Bottle Alignment Chamber
41, Exhaust Chamber
42, Thin Film Formation Chamber
43, Vacuum Release Chamber
44, Removal Chamber
50, Cooled Liquid or Gas
51, Container Cooling Means
100, 200, 300, Apparatus for Manufacturing a Gas Barrier Plastic Container

PREFERRED EMBODIMENTS OF THE INVENTION

The present invention is described in detail below with reference to preferred embodiments, but it should not be interpreted that the present invention is limited to these descriptions. A plasma CVD film forming apparatus according to the present embodiments is described with reference to FIGS. 1~12. Further, the same symbols are applied to the same portions/parts.

(First Embodiment: Film Formation on Inner Surface of Container)

Figure 1A:
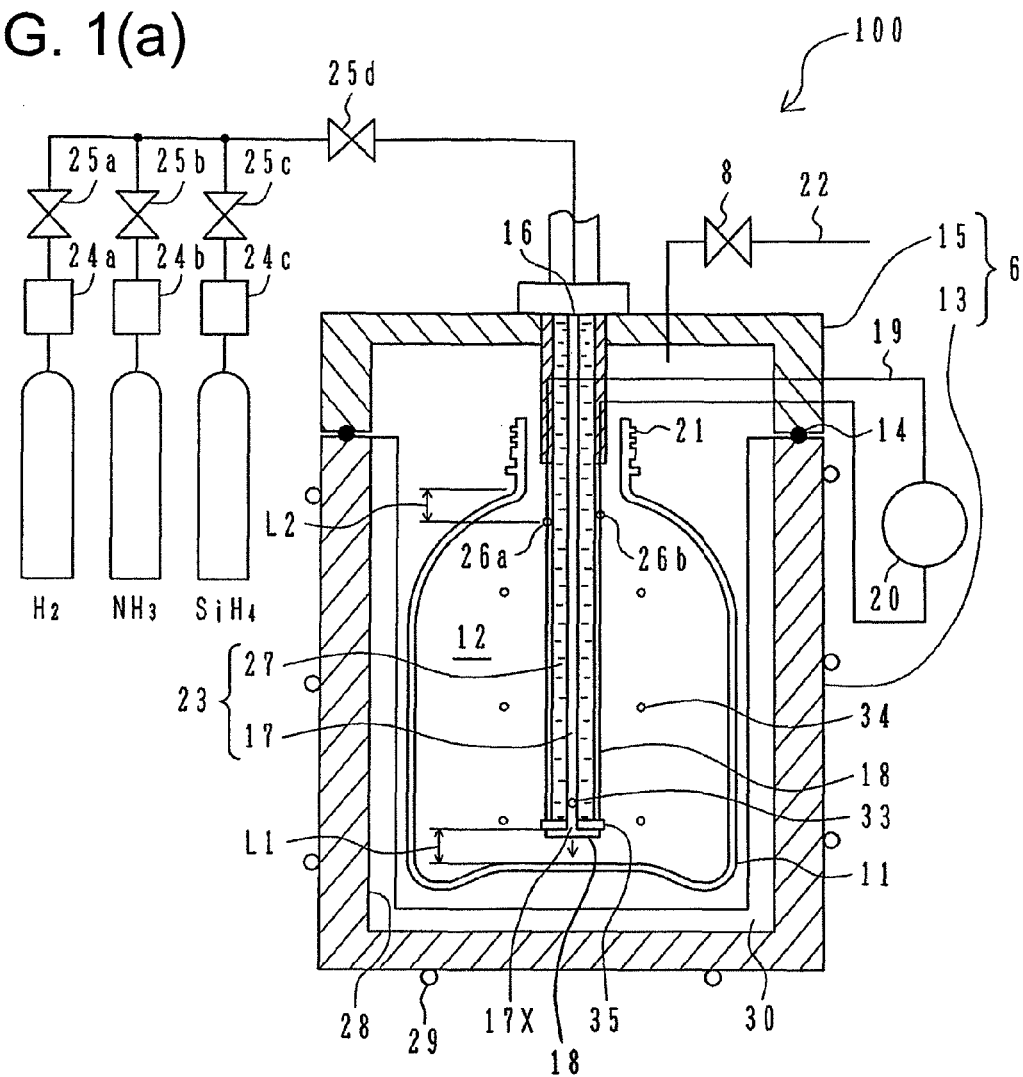
FIG. 1 is a schematic drawing showing one embodiment of the apparatus for manufacturing a gas barrier plastic container according to the first embodiment, wherein (a) is the case where the thermal catalyst has a linear shape, (b) is the case where the thermal catalyst has a coil spring shape, and (c) is the case where the thermal catalyst has a zigzag line shape.

First, a description will be given for an apparatus for manufacturing a gas barrier plastic container according to a first embodiment which makes it possible to form a gas barrier thin film on the inner surface of a container. FIG. 1 is a schematic drawing showing one embodiment of the apparatus for manufacturing a gas barrier plastic container according to the first embodiment, wherein (a) is the case where the thermal catalyst has a linear shape, (b) is the case where the thermal catalyst has a coil spring shape, and (c) is the case where the thermal catalyst has a zigzag line shape. However, FIGS. 1 (b) (c) are partial enlarged views of a source gas supply pipe 23. Further, unless notice is given explicitly, "FIG. 1" is described as "FIG. 1(a)" below. An apparatus 100 for manufacturing a gas barrier plastic container shown in FIG. 1 has a vacuum chamber 6 for housing a plastic container 11, an exhaust pump (not shown in the drawings) which evacuates the vacuum chamber 6, a source gas supply pipe 23 formed from an insulating and heat resistant material which is arranged to be insertable into and removable from the inside of the plastic container 11 to supply a source gas to the inside of the plastic container 11, a thermal catalyst 18 which is supported on the source gas supply pipe 23, and a heater power supply 20 which supplies electricity to heat the thermal catalyst 18.

In the vacuum chamber 6, a space for housing the plastic container 11 is formed in the inside, and this space forms a reaction chamber 12 for thin film formation. The vacuum chamber 6 is constructed from a lower chamber 13 and an upper chamber 15 which is mounted so as to be freely attachable to and detachable from the upper portion of the lower chamber 13 and seals the inside of the lower chamber 13 by an O-ring 14. In the upper chamber 15 there is an up-and-down drive mechanism not shown in the drawings, and it moves up and down in accordance with the loading and unloading of the plastic container 11. The space inside the lower chamber 13 is formed to be slightly larger than the external shape of the plastic container 11 housed therein. This plastic container 11 is a beverage bottle, but it may be a container used for other uses.

Inside the vacuum chamber 6, namely, inside the lower chamber 13, preferably the inner surface 28 forms a black inner wall or the inner surface has a surface roughness (Rmax) of 0.5 μm or higher in order to prevent the reflection of light emitted in accordance with the heating of the thermal catalyst 18. The surface roughness (Rmax) is measured using a surface roughness measuring device (DEKTAK3 manufactured by ULVAC TECHNO (Ltd.)), for example. In order to make the inner surface 28 form a black inner wall, there is a plating treatment such as black nickel plating or black chrome plating or the like, a chemical conversion coating treatment such as a RAYDENT or black oxide finish or the like, or a coloring method in which a black paint is applied. Further, cooling means 29 such as a cooling pipe through which cooling water flows or the like are preferably provided on the inside (not shown in the drawings) or the outside (FIG. 1) of the vacuum chamber 6 to prevent the lower chamber 13 from rising in temperature. The reason why in the vacuum chamber 6 the lower chamber 13 is particularly cooled is that, when the thermal catalyst 18 is inserted in the plastic container 11, the thermal catalyst 18 is housed just in the space inside the lower chamber 13. By preventing the reflection of light and cooling the vacuum chamber 6, it is possible to control temperature rises of the plastic container 11 and the resultant thermal deformation. Further, when a chamber 30 made from a transparent body such as a glass chamber, for example, which can pass the emission light generated from the thermal catalyst 18 supplied with electricity is arranged on the inside of the lower chamber 13, because the temperature of the glass chamber touching the plastic container 11 is slow to rise, it is possible to further reduce the thermal effects inflicted on the plastic container 11.

The source gas supply pipe 23 is supported so as to hang down in the center of the inside ceiling surface of the upper chamber 15. A source gas flows into the source gas supply pipe 23 via flow controllers 24a~24c and valves 25a~25d. The source gas supply pipe 23 preferably has a cooling pipe which is formed as an integral body. The structure of this kind of source gas supply pipe 23 is a double pipe structure, for example. In the source gas supply pipe 23, the inside pipeline of the double pipe forms a source gas channel 17, wherein one end is connected to a gas supply port 16 provided in the upper chamber 15, and the other end forms a gas blow out hole 17x. In this way, the source gas is blown out from the gas blow out hole 17x at the tip of the source gas channel 17 connected to the gas supply port 16. On the other hand, the outside pipeline of the double pipe is a cooling water channel 27 for cooling the source gas supply pipe 23, and acts as a cooling pipe. Further, when the thermal catalyst 18 is supplied with electricity to generate heat, the temperature of the source gas channel 17 rises. In order to prevent this, cooling water is circulated in the cooling water channel 27. Namely, at one end of the cooling water channel 27, cooling water is supplied from cooling water supply means not shown in the drawings connected to the upper chamber 15, and at the same time the cooling water that has finished cooling is returned to the cooling water supply means. On the other hand, the other end of the cooling water channel 27 is sealed near the gas blow out hole 17x, and here the cooling water turns back and returns. The entire source gas supply pipe 23 is cooled by the cooling water channel 27. By carrying out cooling, it is possible to reduce the thermal effects inflicted on the plastic container 11. Accordingly, the material of the source gas supply pipe 23 is preferably an insulating material having a high thermal conductivity. For example, it is preferably a ceramic pipe formed from a material in which aluminum nitride, silicon carbide, silicon nitride or aluminum oxide forms the main component, or a metal pipe whose surface is coated with a material in which aluminum nitride, silicon carbide, silicon nitride or aluminum oxide forms the main component. It is possible to supply electricity in a stable manner to the thermal catalyst, it has durability, and it is possible to exhaust heat efficiently by thermal conduction of the heat generated by the thermal catalyst.

The source gas supply pipe 23 may be formed as another embodiment not shown in the drawings as follows. Namely, the source gas supply pipe forms a double pipe, the outside pipe forms a source gas channel, and a hole, preferably a plurality of holes are formed in the side wall of the outside pipe. On the other hand, the inside pipe of the double pipe of the source gas supply pipe is formed by a fine pipe which forms a cooling water channel through which cooling water flows. The thermal catalyst is wired along the side wall of the source gas supply pipe, and the source gas that passes through the holes provided in the side wall of the outside pipe makes contact with the portion of the thermal catalyst along the side wall, and this makes it possible to create a chemical species efficiently.

If the gas blow out hole 17x is separated too far from the bottom of the plastic container 11, it is difficult to form a thin film on the inside of the plastic container 11. In the present embodiment, the length of the source gas supply pipe 23 is preferably formed so that the distance L1 from the blow out hole 17x to the bottom of the plastic container 11 is 5~30 mm. This improves the uniformity of the thin film. At the distance 5~30 mm, it is possible to form a uniform thin film on the inside surface of the plastic container 11. If the distance is larger than 30 mm, it becomes difficult to form a thin film on the bottom of the plastic container 11, and if the distance is smaller than 5 mm, it becomes difficult to blow out the source gas. This fact can also be understood theoretically. In the case of a 500 ml container, the body diameter of the container is 6.4 cm, and from the mean free path $\lambda=0.68/Pa[cm]$ in air at room temperature, the molecular flow is seen at a pressure <0.106 Pa, the viscous flow is a pressure >10.6 Pa, and the intermediate flow is 0.106 Pa <pressure <10.6 Pa. At a gas pressure of 5~100 Pa at the time of film formation, the gas flow forms a viscous flow, and optimum conditions are formed at the distance between the gas blow out hole 17x and the bottom of the plastic container 11.

The thermal catalyst 18 promotes the decomposition of the source gas in a catalytic chemical vapor deposition method. In the present embodiment, the thermal catalyst 18 is preferably constructed from a material that includes one or two or more metal elements selected from among the group of C, W, Ta, Ti, Hf, V, Cr, Mo, Mn, Tc, Re, Fe, Ru, Os, Co, Rh, Ir, Ni, Pd and Pt. By having electrical conductivity, it becomes possible to generate heat itself by supplying electricity. The thermal catalyst 18 is formed to have a wiring shape, and one end of the thermal catalyst 18 is connected to a connecting portion 26a which forms a connecting point between the thermal catalyst 18 and wiring 19 provided on the source gas supply pipe 23 below a fixed point in the upper chamber 15. Further, it is supported by an insulating ceramic member 35 provided on the gas blow out hole 17x which is the tip portion. Further, the other end of the thermal catalyst 18 folds back and is connected to a connecting portion 26b. In this way, because the thermal catalyst 18 is supported along the side surface of the source gas supply pipe 23, it becomes arranged to be positioned roughly on the principal axis of the space inside the lower chamber 13. FIG. 1(a) shows the case where the thermal catalyst 18 is arranged along the periphery of the source gas supply pipe 23 so as to be parallel to the axis of the source gas supply pipe 23, but with the connecting portion 26a as a starting point, it may be wound in a spiral shape around the side surface of the source gas supply pipe 23, and then after being supported by the insulating ceramic 35 fixed near the gas blow out hole 17x, it is folded back and returns to the connecting portion 26b. Here, the thermal catalyst 18 is fixed to the source gas supply pipe 23 by being hooked on the insulating ceramic 35. FIG. 1(a) shows the case where the thermal catalyst 18 is arranged near the gas blow out hole 17x of the source gas supply pipe 23 on the outside of the gas blow out hole 17x. In this way, because it is easy for the source gas blown out from the gas blow out hole 17x to make contact with the thermal catalyst 18, the source gas can be activated efficiently. Here, the thermal catalyst 18 is preferably arranged to be slightly separated from the side surface of the source gas supply pipe 23. This is for moderating sudden temperature rises of the source gas supply pipe 23. Further, it is possible to increase the opportunity for contact between the source gas blown out from the gas blow out hole 17x and the source gas in the reaction chamber 12. The outer diameter of the source gas supply pipe 23 including the thermal catalyst 18 needs to be smaller than the inner diameter of a mouth portion 21 of the plastic container. This is because the source gas supply pipe 23 including the thermal catalyst 18 is inserted from the mouth portion 21 of the plastic container. Accordingly, when the thermal catalyst 18 is separated further than necessary from the surface of the source gas supply pipe 23, the thermal catalyst 18 is easier to contact the mouth portion 21 of the plastic container at the time when the source gas supply pipe 23 is inserted from the mouth portion 21 of the plastic container. The width of the thermal catalyst 18 is suitably greater than 10 mm and less than (inner diameter of mouth portion 21-6) mm when considering position shifts at the time of insertion from the mouth portion 21 of the plastic container. Here, the inner diameter of the mouth portion 21 is approximately 21.7~39.8 mm.

The maximum temperature at the time when the thermal catalyst 18 is heated is preferably less than the temperature at which the thermal catalyst softens. The maximum temperature is different depending on the material of the thermal catalyst, but is preferably 2100° C. when it is tungsten, for example. Further, when the thermal catalyst 18 is tungsten, the operating temperature of the thermal catalyst is preferably made 1600~2100° C.

Figure 1B:
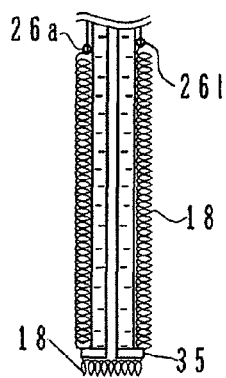
Figure 1C:
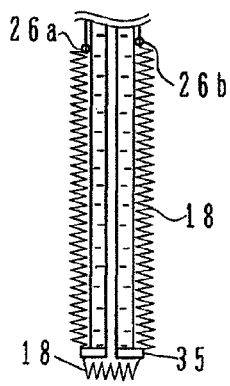

Further, the thermal catalyst 18 preferably has a portion in which a wire is processed to form a coil spring shape as shown in FIG. 1(b) in order to increase the opportunity for contact with the source gas. The coil spring shape is not limited to a cylindrical shape, and includes a conical shape, a barrel shape or an hourglass shape, and includes irregular pitch shapes in which the pitch between these windings is changed. Further, it may have a portion in which the wire is processed to form a zigzag line shape as shown in FIG. 1(c). Alternatively, it may have a portion in which the wire is processed to form a wavy line shape (not shown in the drawings). In any of these shapes, the thermal catalyst 18 is preferably arranged along the blow out direction of the source gas. In this way, the opportunity for the source gas 33 to make contact with the thermal catalyst 18 increases.

With regard to the method of fixing the thermal catalyst 18 to the source gas supply pipe 23, the following may be given as another embodiment not shown in the drawings. Namely, the source gas supply pipe is formed as a double pipe, wherein the outside pipe is formed by a porous pipe having a porosity of 10~40% which forms a source gas channel. The thermal catalyst may be wound directly around this porous outside pipe. The fixing stability of the thermal catalyst is improved, and because the source gas is emitted from both the gas blow out hole and the side wall of the outside pipe, the contact efficiency with the thermal catalyst is enhanced. In this case, the inside pipe of the double pipe of the source gas supply pipe is formed by a fine pipe which forms a cooling water channel through which cooling water flows.

Figure 10:
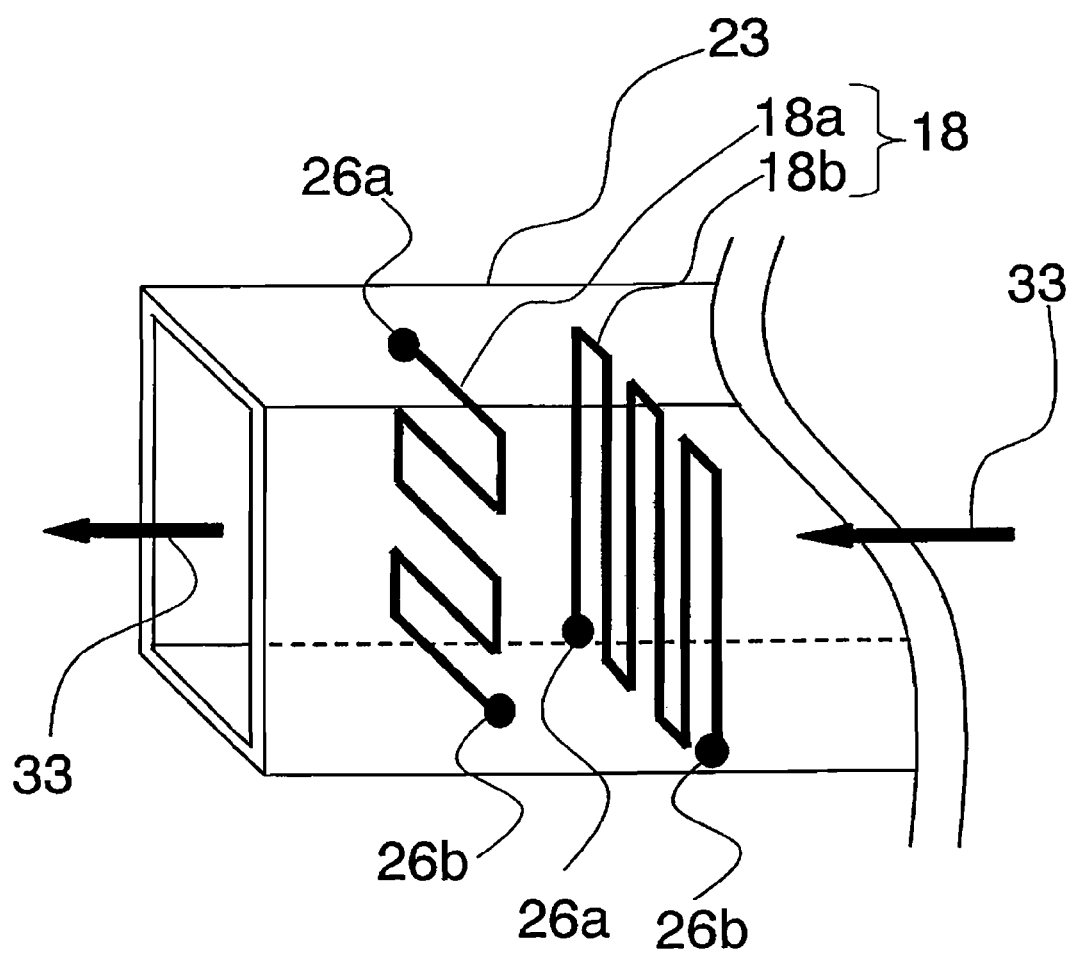
FIG. 10 shows another embodiment of the positional relationship of the thermal catalyst and the source gas supply pipe.

FIG. 10 shows another embodiment of the positional relationship of the thermal catalyst 18 and the source gas supply pipe 23. In FIG. 10, the thermal catalyst 18 is arranged inside the source gas supply pipe 23. The thermal catalyst 18 is arranged in two rows along the blow out direction of the source gas 33. In this way, the opportunity for the source gas 33 to make contact with the thermal catalyst 18 is increased. Further, because the thermal catalyst is arranged inside the source gas supply pipe, the distance between the thermal catalyst and the surface of the plastic container can be made large, and this makes it possible to control the occurrence of thermal deformations of the plastic container. As shown in FIG. 10, thermal catalysts 18a, 18b are preferably arranged so that the respective wire portions face different directions. In FIG. 10, the wires are in a mutually different vertical and horizontal relationship. Further, the shape of a pipe cross section of the source gas supply pipe 23 is a square in FIG. 10, but it may be a circle, an ellipse or a rectangle. Further, if insertion from the mouth portion of the plastic container is carried out to form a film on the inside surface of the plastic container, the pipe diameter needs to be smaller than the mouth portion diameter. On the other hand, in the case where a film is formed on the outside surface of the plastic container, the pipe diameter is preferably made larger to expand the gas flow rate.

The heater power supply 20 is connected to the thermal catalyst 18 via the connecting portions 26a, 26b and the wiring 19. By applying electricity to the thermal catalyst 18 with the heater power supply 20, the thermal catalyst 18 generates heat.

Further, because the stretch ratio is relatively small at the time when the plastic container 11 is formed from the mouth portion 21 of the plastic container to the shoulder of the container, when the thermal catalyst 18 which generates heat at a high temperature is arranged nearby, deformation due to heat is easy to occur. According to experiments, if the positions of the connecting portions 26a, 26b at the connecting points with the wiring 19 and the thermal catalyst 18 were not separated more than 10 mm from the bottom end of the mouth portion 21 of the plastic container, portions of the shoulder of the plastic container 11 underwent thermal deformation, and if they were separated more than 30 mm, it was difficult to form a thin film on portions of the shoulder of the plastic container 11. In this regard, the thermal catalyst 18 is preferably arranged so that the upper end thereof is positioned 10~30 mm below from the lower end of the mouth portion 21 of the plastic container. Namely, the distance L2 between the connecting portions 26a, 26b and the lower end of the mouth portion 21 is preferably made 10~30 mm. This makes it possible to control thermal deformation of the shoulder portion of the container.

Further, an exhaust pipe 22 communicates with the space inside the upper chamber 15 via a vacuum valve 8, and the air of the reaction chamber 12 inside the vacuum chamber 6 is exhausted by an exhaust pump not shown in the drawings.

Figure 2A:
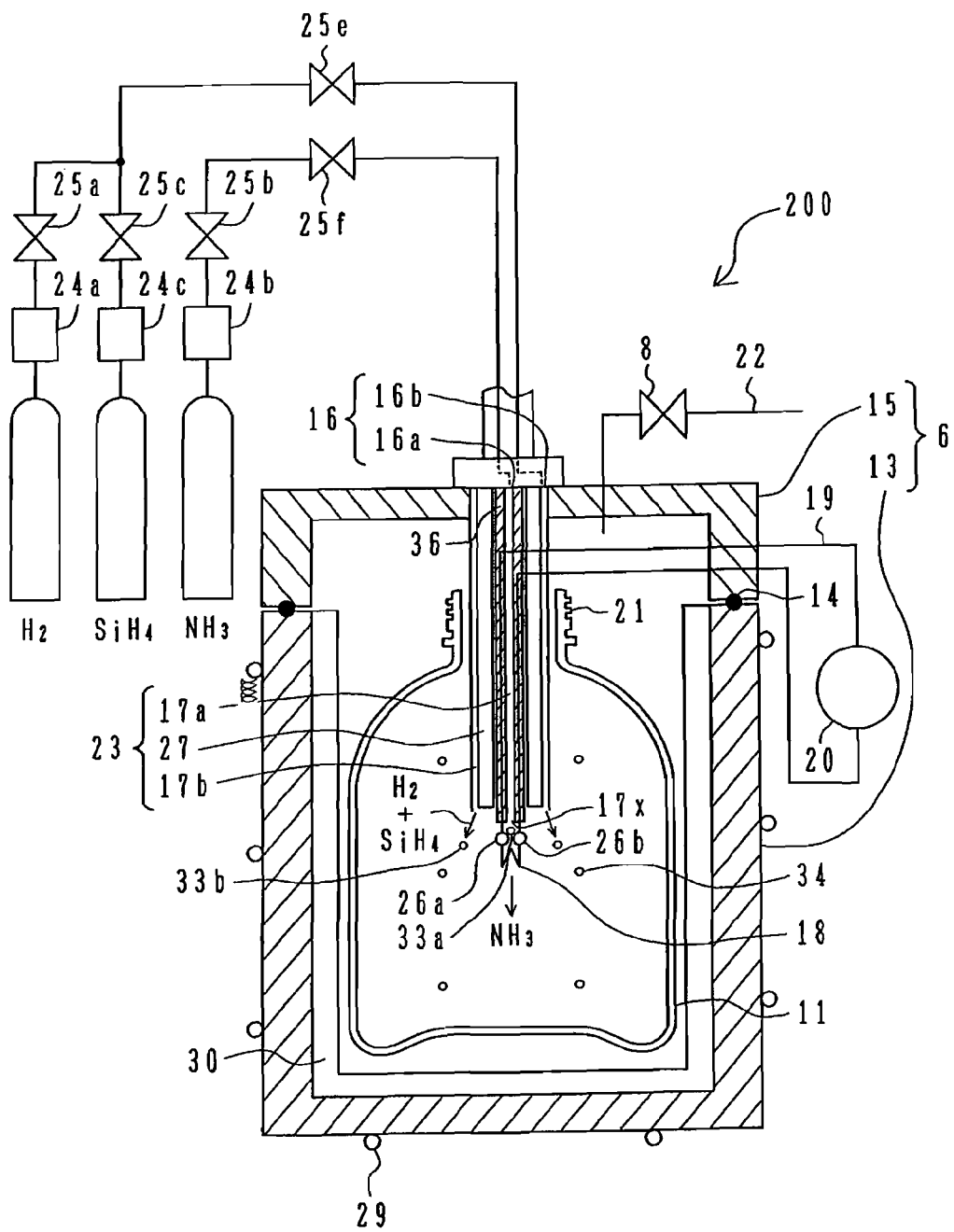
FIG. 2 is a schematic drawing showing another embodiment of the apparatus for manufacturing a gas barrier plastic container according to the first embodiment, wherein (a) is the case where the thermal catalyst has an inverted M-letter shape, (b) is the case where the thermal catalyst has a coil spring shape, and (c) is the case where the thermal catalyst has a zigzag line shape.

FIG. 2 is a schematic drawing showing another embodiment of the apparatus for manufacturing a gas barrier plastic container according to the first embodiment, wherein (a) is the case where the thermal catalyst has an inverted M-letter shape, (b) is the case where the thermal catalyst has a coil spring shape, and (c) is the case where the thermal catalyst has a zigzag line shape. However, FIGS. 2 (b) (c) are partial enlarged views of a source gas supply pipe 23. Further, unless notice is given explicitly, "FIG. 2" is described as "FIG. 2(a)" below. An apparatus 200 for manufacturing a gas barrier plastic container shows the case where the source gas supply pipe 23 is formed to have a triple pipe structure. The inside pipe of the triple pipe forms a source gas channel 17a through which a source gas 33a flows via a gas supply port 16a. The wiring 19 is arranged along the inner surface side or the inside or the outer surface side of the source gas channel 17a which is the inner pipe of the triple pipe so as to be parallel to the principle axis thereof. At the tip of the source gas channel 17a, the thermal catalyst 18 is arranged at the exit side of the source gas blow out hole 17x at a position which makes contact with the blown out source gas 33a. Namely, in the apparatus 200 for manufacturing a gas barrier plastic container, the thermal catalyst 18 is not arranged on the side surface of the source gas supply pipe 23, and is arranged only at the exit side of the gas blow out hole 17x. Further, the thermal catalyst 18 is connected to the connecting portions 26a, 26b provided on the end of the wiring 19. The middle pipe of the triple pipe forms the cooling water channel 27 through which cooling water flows. The outside pipe of the triple pipe forms a source gas channel 17b through which a source gas 33b flows via a gas supply port 16b. This embodiment is suited to the time when the source gases 33a, 33b flowing respectively through the inside pipe and outside pipe are different kinds of gases. The source gases 33a, 33b can be mixed together at the exit side of the gas blow out hole 17x of the source gas supply pipe 23. The triple pipe is preferably formed from an insulating ceramic. Here, in the case where one portion of the source gas undergoes a chemical reaction with the thermal catalyst 18 below 1,590° C., the apparatus 200 for manufacturing a gas barrier plastic container makes it possible to prevent such chemical reaction. For example, in the case where the thermal catalyst 18 is tungsten and one portion of the source gas is silicon tetrahydride (silane), when the tungsten is below 1,590° C., both will undergo chemical reactions, and the electrical resistance of the thermal catalyst 18 will end up being lowered. For this reason, in order to prevent contact between the source gas 33b and the thermal catalyst 18 below 1,590° C., a housing mechanism of the thermal catalyst 18 is preferably provided in the inside of the source gas supply pipe 23. Namely, in order to change the relative positions of the inside pipe, the middle pipe and the outside pipe with respect to the axial direction of the triple pipe to make it possible for the tip of the inside pipe where the thermal catalyst 18 is arranged to be inserted and removed from the middle pipe and the outside pipe, a telescopic mechanism for the inside pipe or a telescopic mechanism for the middle pipe and the outside pipe is provided between the upper chamber 15 and the triple pipe. The telescopic mechanism may be a bellows, for example. In this way, the life of the thermal catalyst 18 can be extended. When electricity is supplied to the thermal catalyst 18, the thermal catalyst 18 generates heat. After that, the inside pipe of the triple pipe is extended. Then, the thermal catalyst 18 arranged on the tip of the source gas channel 17a protrudes from the inside of the source gas supply pipe 23, and the thermal catalyst 18 is forced to make contact simultaneously with both gases of the source gas 33a and the source gas 33b. Even when the thermal catalyst 18 reaches a high temperature, because the source gas 33b is reducing ammonia ($NH_3$) gas, a chemical reaction does not occur even when contact is made.

Figure 2B:
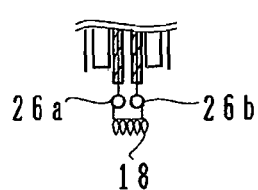
Figure 2C:
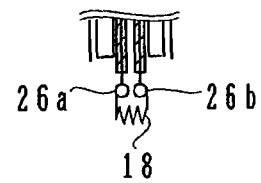

Further, the thermal catalyst 18 preferably has a portion in which a wire is processed to form a coil spring shape as shown in FIG. 2(b) in order to increase the opportunity for contact with the source gas. The coil spring shape is not limited to a cylindrical shape, and includes a conical shape, a barrel shape or an hourglass shape, and includes irregular pitch shapes in which the pitch between these windings is changed. Further, it may have a portion in which the wire is processed to form a zigzag line shape as shown in FIG. 2(c). Alternatively, it may have a portion in which the wire is processed to form a wavy line shape (not shown in the drawings). In any of these shapes, the thermal catalyst 18 is preferably arranged along the blow out direction of the source gas. For example, a plural arrangement of the thermal catalyst 18 may be formed, or the thermal catalyst 18 may be given a vector component in the blow out direction of the source gas. In this way, the opportunity for the source gas to make contact with the thermal catalyst increases.

Further, in the case where a DLC thin film is formed, for example, in the case where the source gas is a source gas formed from hydrogen and carbon such as methane gas or acetylene gas, the thermal catalyst 18 will not undergo a chemical reaction with the source gas. In this case, in the manufacturing apparatus of FIG. 2, the thermal catalyst 18 may be fixed in the state where it is housed inside the source gas supply pipe 23, or the thermal catalyst 18 may be fixed in the state where it protrudes from the source gas supply pipe 23, without providing the telescopic mechanism.

The container according to the present invention includes a container that uses a cover or a stopper or is sealed, or a container used in an open state that does not use these. The size of the opening is determined in accordance with the contents. The plastic container includes a plastic container having a moderate stiffness and a certain thickness, and a plastic container formed from a sheet material that does not have stiffness. The substance that is filled into the plastic container according to the present invention can be a beverage such as a carbonated beverage or a fruit juice beverage or a soft drink or the like. Further, the container may be either a returnable container or a one-way container.

The resin used when forming the plastic container 11 of the present invention can be polyethylene terephthalate (PET) resin, polybutylene terephthalate resin, polyethylene naphthalate resin, polyethylene resin, polypropylene (PP) resin, cycloolefin copolymer (COC, annular olefin copolymer) resin, ionomer resin, poly-4-methylpentene-1 resin, polymethyl methacrylate resin, polystyrene resin, ethylene-vinyl alcohol copolymer resin, acrylonitrile resin, polyvinyl chloride resin, polyvinylidene chloride resin, polyamide resin, polyamide-imide resin, polyacetal resin, polycarbonate resin, polysulfone resin, or ethylene tetrafluoride resin, acrylonitrile-styrene resin, acrylonitrile-butadiene-styrene resin. Of these, PET is particularly preferred.

In the apparatus for manufacturing a gas barrier plastic container according to the first embodiment, the source gas is suitably selected from among known source gases used by the CVD method in accordance with the type of the targeted gas barrier thin film. Because the apparatus for manufacturing a gas barrier plastic container and the method of manufacturing the container according to the present invention can form various thin films such as inorganic films, organic films and the like, the conceptual scope of the manufacturing apparatus and manufacturing method should not be interpreted based on the type of source gas used.

The source gas for a carbon thin film may be an alkane gas such as methane, ethane, propane, butane, pentane, hexane or the like, an alkyne gas such as ethylene, propylene, butyne or the like, an alkadiene gas such as butadiene, pentadiene or the like, an alkyne gas such as acetylene, methyl acetylene or the like, an aromatic hydrocarbon gas such as benzene, toluene, xylene, indene, naphthalene, phenanthrene or the like, a cycloalkane gas such as cyclopropane, cyclohexane or the like, a cycloalkene gas such as cyclopentene, cyclohexene or the like, an alcohol gas such as methanol, ethanol or the like, a ketone gas such as acetone, methyl ethyl ketone or the like, or an aldehyde gas such as formaldehyde, acetaldehyde or the like, for example.

The source gas for a silicon thin film may be dimethoxy (methyl) silane, ethoxy dimethyl silane, dimethoxy dimethyl silane, trimethoxy methyl silane, tetramethoxy silane, tetramethyl silane, dimethoxy methyl silane, ethoxy trimethyl silane, diethoxy methyl silane, ethoxy dimethyl vinyl silane, allyl trimethyl silane, diethoxy dimethyl silane, tolyl ethyl silane, hexamethyl disiloxane, hexamethyl disilane, diethoxy methyl vinyl silane, triethoxy methyl silane, triethoxy vinyl silane, bis(trimethyl silyl)acetylene, tetraethoxy silane, trimethoxy phenyl silane, v-glycidoxy propyl (dimethoxy)methyl silane, v-glycidoxy propyl (trimethoxy)methyl silane, v-methacryloxy propyl (dimethoxy)methyl silane, v-methacryloxy propyl (trimethoxy)methyl silane, dihydroxy diphenyl silane, diphenyl silane, triethoxy phenyl silane, tetraisopropoxy silane, dimethoxy diphenyl silane, diethoxy diphenyl silane, tetra-n-butoxy silane, tetraphenoxy silane, or poly (methyl hydrogen siloxane), for example.

Among them, the source gas for a Si—C—N thin film may be an amino silicon compound such as tetrakis dimethyl amino silane, tris dimethyl amino silane, bis dimethyl amino silane, dimethyl amino silane or the like, for example.

The source gas for a Si—C thin film may be an alkyl silicon compound such as dimethyl silane, monomethyl silane, trimethyl silane, tetramethyl silane, monoethyl silane, diethyl silane, triethyl silane, tetraethyl silane or the like, for example.

The source gas for a Si—C—O thin film may be an alkoxy silicon compound such as tetraethoxy silane, dimethyl dimethoxy silane, dimethyl hexa methoxy trisilane or the like.

These source gases can be used individually or in combination to form a hydrogen-containing $SiN_x$ thin film, a hydrogen-containing DLC thin film, a hydrogen-containing $SiO_x$ thin film or a hydrogen-containing $SiC_xN_y$ thin film as a gas barrier thin film.

Further, it is possible to raise the film quality of the gas barrier thin film by introducing a gas such as hydrogen, oxygen, nitrogen, water vapor, ammonia or $CF_4$ which does not polymerize but participates in the chemical reactions in the source gas into the reaction chamber 12 where the heat-generating thermal catalyst 18 exists. For example, in the case where a silicon nitride thin film is formed, silane, ammonia and hydrogen are combined to form a source gas.

The source gas and a dilution gas may be mixed together. For example, an inert gas such as argon or helium or the like is inactive in the chemical reactions at the time of film formation, and can be used for adjusting the concentration of the source gas and adjusting the pressure inside the vacuum chamber.

(Second Embodiment: Film Formation on Outer Surface of Container)

Figure 3A:
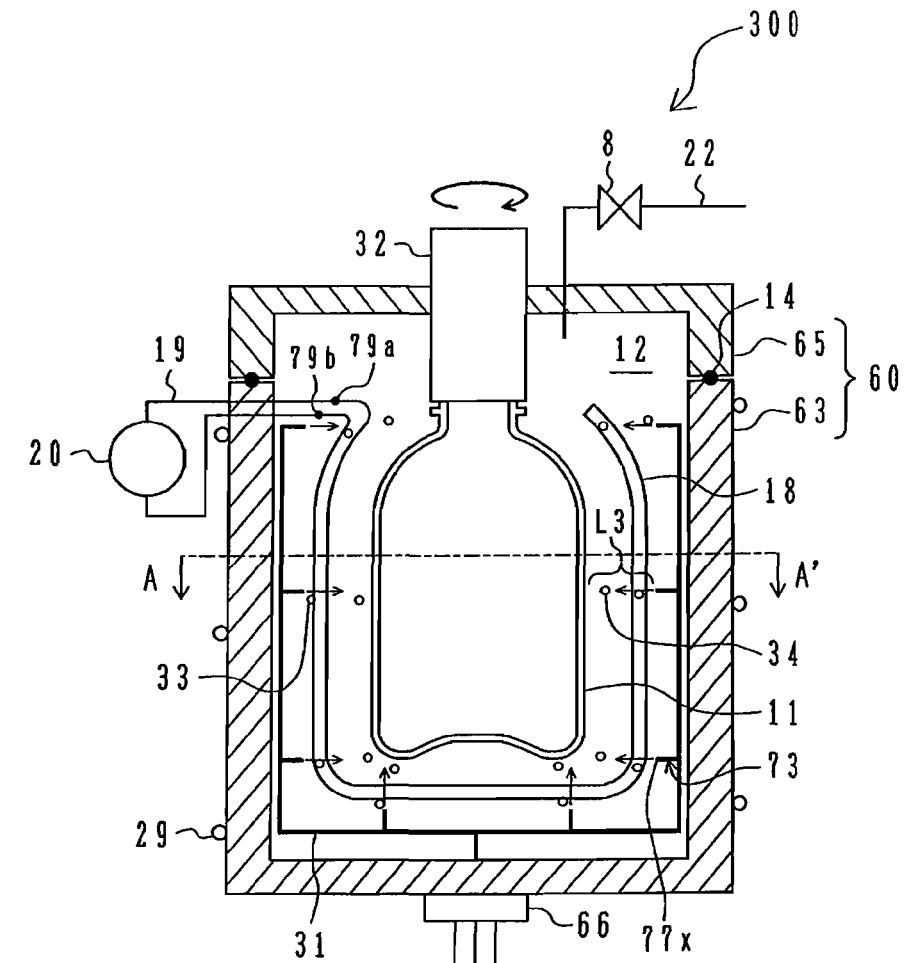
FIG. 3 is a schematic drawing showing one embodiment of the apparatus for manufacturing a gas barrier plastic container according to the second embodiment, wherein (a) is the case where the thermal catalyst has a linear shape, and (b) is the case where the thermal catalyst has a coil spring shape.
Figure 3B:
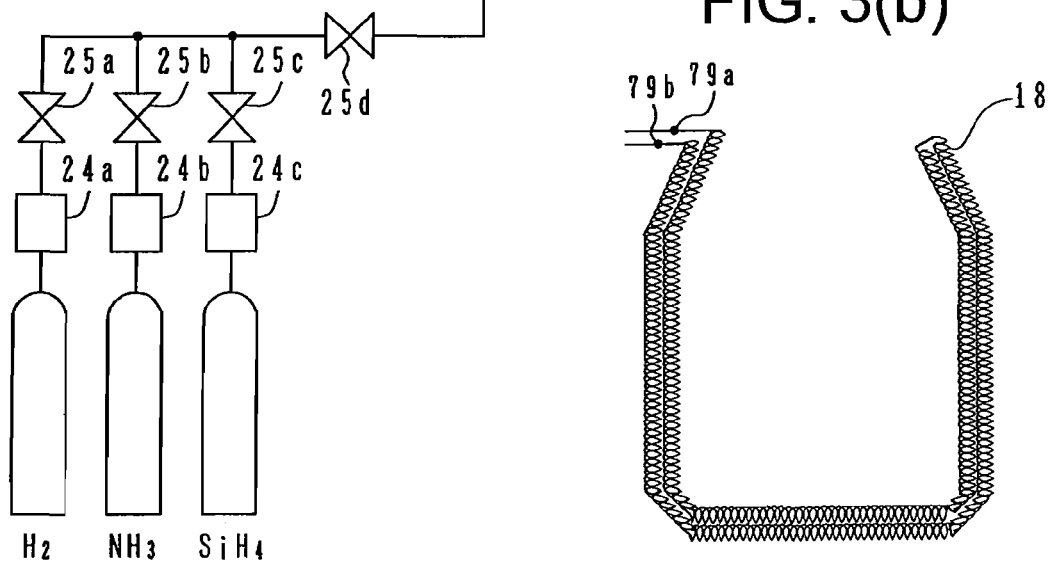

Next, a description will be given for an apparatus for manufacturing a gas barrier plastic container according to the second embodiment, which makes it possible to form a gas barrier thin film on the outer surface of a container. FIG. 3 is a schematic drawing showing one embodiment of the apparatus for manufacturing a gas barrier plastic container according to the second embodiment, wherein (a) is the case where the thermal catalyst has a linear shape, and (b) is the case where the thermal catalyst has a coil spring shape. However, FIG. 3(b) is a schematic drawing of the thermal catalyst. Further, unless notice is given explicitly, "FIG. 3" is described as "FIG. 3(a)" below. An apparatus 300 for manufacturing a gas barrier plastic container shown in FIG. 3 has a vacuum chamber 60 for housing a plastic container 11, an exhaust pump (not shown in the drawings) which evacuates the vacuum chamber 60, a thermal catalyst 18 which is arranged on the periphery the plastic container 11, a source gas pipeline 31 which supplies a source gas to the space outside the plastic container 11 in the inside of the vacuum chamber 60, and a heater power supply 20 which supplies electricity to heat the thermal catalyst 18. In the apparatus 300 for manufacturing a gas barrier plastic container, the mouth portion of the plastic container 11 is fixed by a bottle rotating mechanism 32, and the plastic container 11 is arranged so that the bottom does not touch the inside of the vacuum chamber 60.

In the vacuum chamber 60, a space for housing the plastic container 11 is formed in the inside, and this space forms a reaction chamber 12 for thin film formation. The vacuum chamber 60 is constructed from a lower chamber 63 and an upper chamber 65 which is mounted so as to be freely attachable to and detachable from the upper portion of the lower chamber 63 and seals the inside of the lower chamber 63 by an O-ring 14. In the upper chamber 65 there is an up-and-down drive mechanism not shown in the drawings, and it moves up and down in accordance with the loading and unloading of the plastic container 11. The space inside the lower chamber 63 is formed to be larger than the external shape of the plastic container 11 in order to make it possible for the thermal catalyst 18 to be arranged on the periphery of the plastic container 11 housed therein.

Figure 4:
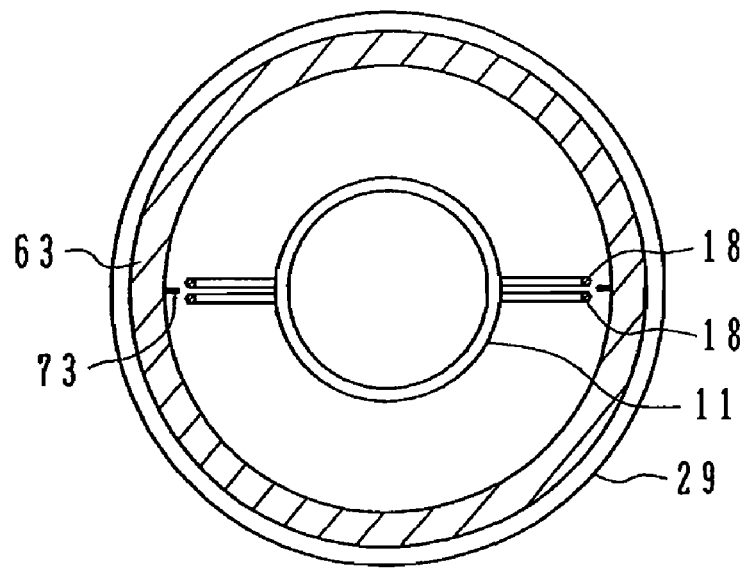
FIG. 4 shows a cross-sectional view taken along A-A'.
Figure 5:
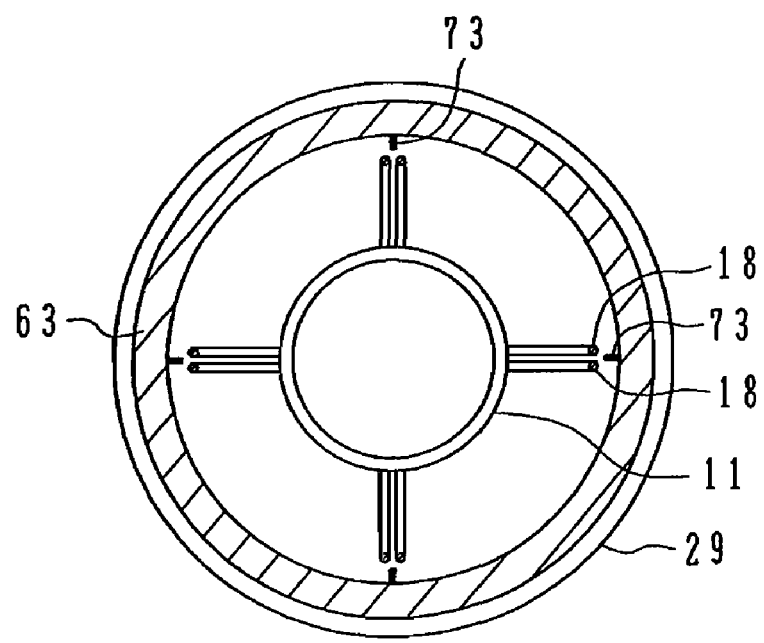
FIG. 5 shows a cross-sectional view taken along A-A'.

Here, one end of the thermal catalyst 18 is connected to a connecting portion 79a which is the connecting point between the wiring 19 and the thermal catalyst 18. Further, in the manufacturing apparatus of FIG. 3, with the connecting portion 79a as a starting point, the thermal catalyst 18 is arranged in a linear state from a side surface inside the lower chamber 63 across the bottom surface to the facing side surface, folds back from there, and is arranged once more in a linear state to the facing side surface, the bottom surface and the inside side surface, and the other end is connected to a connecting portion 79b. In order to show the positional relationship between the thermal catalyst 18 and the plastic container 11 at this time, a cross-sectional view taken along A-A' is shown in FIG. 4. The thermal catalyst 18 and the plastic container 11 are arranged with equal spacing left and right in the drawing. The thermal catalyst 18 is arranged so that the distance with the outer surface of the plastic container 11 becomes fixed. This improves the uniformity of the film thickness on the outer surface including the bottom of the container. Further, two or more thermal catalysts 18 may be arranged. In this case, the thermal catalyst 18 is preferably arranged in a plural manner at rotationally symmetric positions with respect to the principal axis of the plastic container. In order to show the positional relationship between the thermal catalyst 18 and the plastic container 11 in the case where two thermal catalysts 18 are arranged, a cross-sectional view taken along A-A' is shown in FIG. 5. The thermal catalyst 18 and the plastic container 11 are arranged with equal spacing top, bottom, left and right in the drawing. In either case shown in FIG. 4 or FIG. 5, by carrying out film formation while the plastic container 11 is rotated with the principle axis at the center by the bottle rotating mechanism 32, it is possible to improve the uniformity of the film formation. In particular, in the case of FIG. 4, because there is one thermal catalyst 18, the effect of the uniformity improvement of the film formation is high. Although not shown in the drawings, as another embodiment of the arrangement of the thermal catalyst 18, there is an embodiment in which it is wound in a spiral shape around the periphery of the plastic container 11 with the principle axis of the plastic container 11 at the center, or there is an embodiment in which a plurality of annular thermal catalysts are arranged parallel by being wound respectively parallel on a plurality of cross sections of the principle axis of the plastic container 11. In either embodiment, it is possible to improve the uniformity of the film thickness. Of course, in this embodiment too, film formation may be carried out while the plastic container 11 is rotated with the principle axis at the center by the bottle rotating mechanism 32. Here, in the case where there is a plural arrangement of thermal catalysts 18, they are preferably arranged to be separated from each other by 5 cm or more. This makes it easy to obtain high production efficiency for chemical species and uniformity of the film thickness without inflicting thermal damage on the plastic container. The material of the thermal catalyst 18 may be the same as that of the first embodiment.

Further, the thermal catalyst 18 preferably has a portion in which a wire is processed to form a coil spring shape as shown in FIG. 3(b) in order to increase the opportunity for contact with the source gas. The coil spring shape is not limited to a cylindrical shape, and includes a conical shape, a barrel shape or an hourglass shape, and includes irregular pitch shapes in which the pitch between these windings is changed. Further, it may have a portion in which the wire is processed to form a zigzag line shape (not shown in the drawings). Alternatively, it may have a portion in which the wire is processed to form a wavy line shape (not shown in the drawings). In any of these shapes, the thermal catalyst 18 is preferably arranged along the blow out direction of the source gas. For example, a plural arrangement of the thermal catalyst 18 may be formed, or the thermal catalyst 18 may be given a vector component in the blow out direction of the source gas. In this way, the opportunity for the source gas to make contact with the thermal catalyst increases.

One end of the source gas pipeline 31 is connected to a gas supply port 66 provided in the bottom surface of the lower chamber 63. A source gas supply pipe 73 is connected to the other end of the source gas pipeline 31 and an intermediate branch thereof. In FIG. 3 a plurality of source gas supply pipes 73 are provided, and each one has a gas blow out hole 77x provided in the tip thereof. A source gas 33 flows into the source gas supply pipes 73 via the source gas supply line 31, the gas supply port 66, flow controllers 24a~24c and valves 25a~25d. In this way, the source gas 33 is blown out from the gas blow out holes 77x. All of the gas blow out holes 77x are pointed toward the outer surface of the plastic container 11, and the source gas can be blown on any place of the outer surface thereof. Further, the thermal catalyst 18 is arranged at the exit side of the gas blow out holes 77x. In this way, because contact between the thermal catalyst 18 and the source gas occurs frequently, it is possible to increase the yield of chemical species.

The source gas supply pipe 73 is a single pipe made of metal. It may be formed as a double pipe in order to flow cooling water in the same way as the case of the first embodiment. Further, it may be formed as a ceramic pipe or a metal pipe in which the surface of a ceramic material is covered in the same way as the case of the first embodiment.

The length of the source gas supply pipe 73 is preferably formed so that the distance L3 from the blow out hole 77x to the outer surface of the plastic container 11 is 5~30 mm. At the distance 5~30 mm, it is possible to form a uniform thin film on the outer surface of the plastic container 11. If the distance is larger than 30 mm, it becomes difficult to form a thin film on the outer surface of the plastic container 11, and if the distance is smaller than 5 mm, it becomes difficult to blow out the source gas.

As another embodiment of the positional relationship of the thermal catalyst 18 and the source gas supply pipe 73, the thermal catalyst may be arranged inside the source gas supply pipe in the same way as the case of FIG. 10, for example. At this time, if the inner diameter of the source gas supply pipe is made larger than 10 mm, for example, the uniformity of the film distribution will improve. By having the source gas make contact with the thermal catalyst in the inside of the source gas supply pipe, it is possible to blow out chemical species from the source gas supply pipe. Because the thermal catalyst is arranged inside the source gas supply pipe, the distance between the thermal catalyst and the surface of the plastic container can be made large, and this makes it possible to control the occurrence of the thermal deformations of the plastic container.

In order to prevent the thermal deformation of the plastic container 11, cooling means 29 such as a cooling pipe through which cooling water flows or the like are preferably provided on the inside or the outside of the vacuum chamber 60 to prevent the lower chamber 63 from rising in temperature.

A heater power supply 20 is connected to the thermal catalyst 18 via the connecting portions 79a, 79b and the wiring 19. By applying electricity to the thermal catalyst 18 with the heater power supply 20, the thermal catalyst 18 generates heat. In the present embodiment, the maximum temperature at the time when the thermal catalyst 18 is heated is preferably less than the temperature at which the thermal catalyst softens. Further, when the thermal catalyst 18 is tungsten, the operating temperature of the thermal catalyst is preferably made 1600~2100° C.

Further, an exhaust pipe 22 communicates with the space inside the upper chamber 65 via a vacuum valve 8, and the air of the reaction chamber 12 inside the vacuum chamber 60 is exhausted by an exhaust pump not shown in the drawings.

Also in the second embodiment, as another embodiment thereof, in order to control reactions between the thermal catalyst and the source gas below 1,590° C., a triple pipe structure the same as that of the source gas supply pipe 23 in FIG. 2 of the first embodiment may be used for the source gas supply pipe 73, and a housing mechanism which houses the thermal catalyst 18 may be provided inside the source gas supply pipe 73. In this case, because the thermal catalyst 18 is arranged only at the exit side of the gas blow out hole 77x of the source gas supply pipe 73, a plurality of point-like thermal catalysts is arranged on the periphery of the plastic container 11.

In the second embodiment, the source gas species and the type of resin of the plastic container are the same as the case of the first embodiment.

Figure 6:
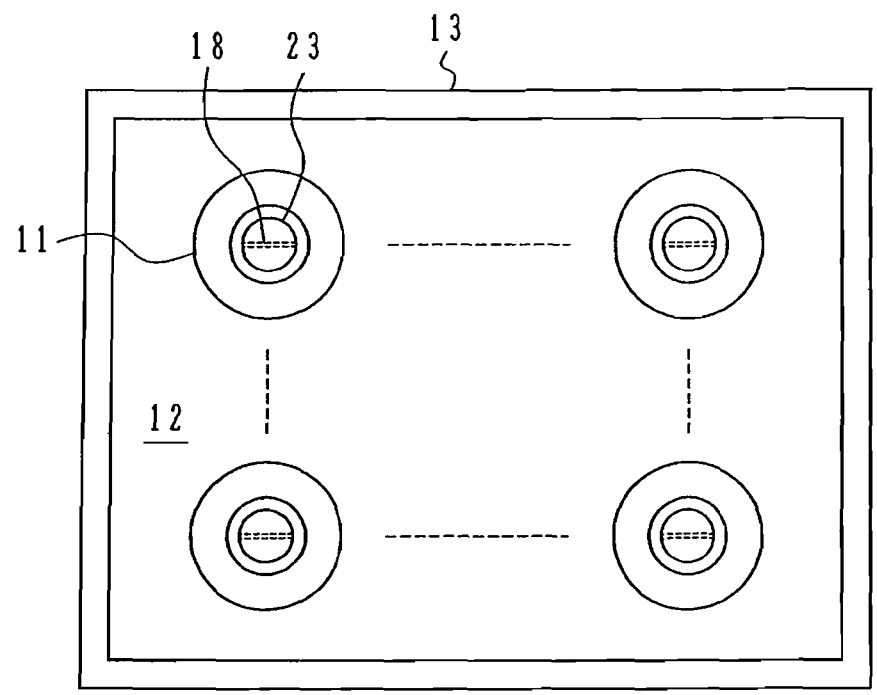
FIG. 6 is a conceptual drawing of an apparatus for forming a gas barrier thin film simultaneously on the inner surface of a plurality of plastic containers.
Figure 7:
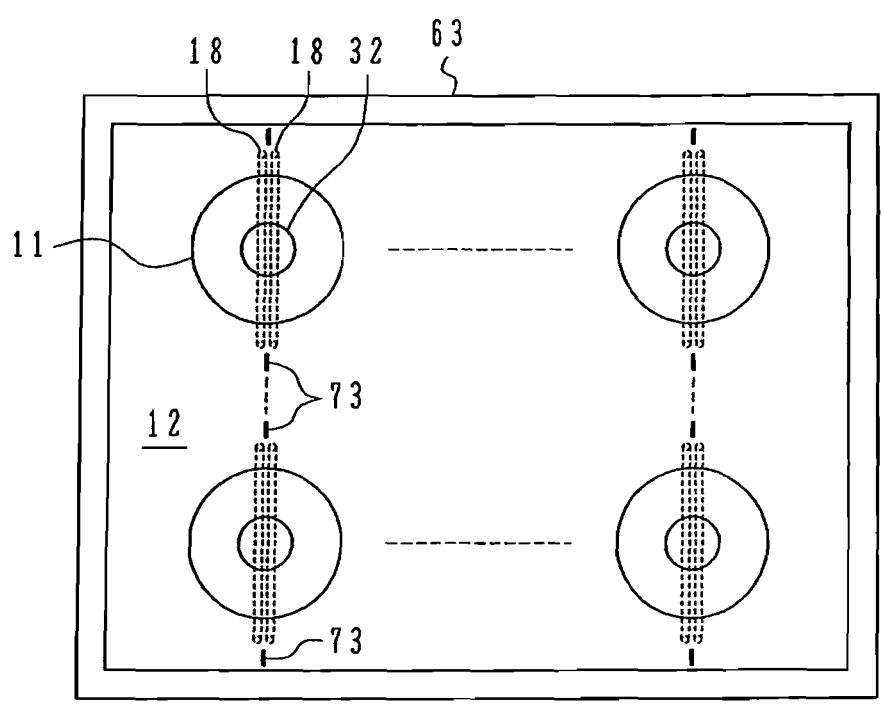
FIG. 7 is a conceptual drawing of an apparatus for forming a gas barrier thin film simultaneously on the outer surface of a plurality of plastic containers.
Figure 8:
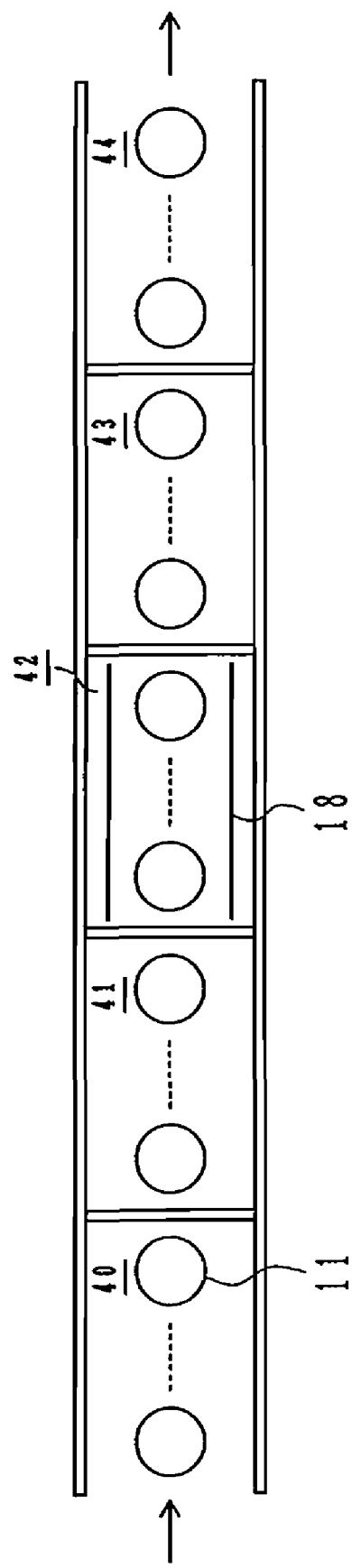
FIG. 8 is a conceptual drawing of an apparatus for forming a gas barrier thin film simultaneously on the outer surface of a plurality of inline plastic containers.
Figure 9:
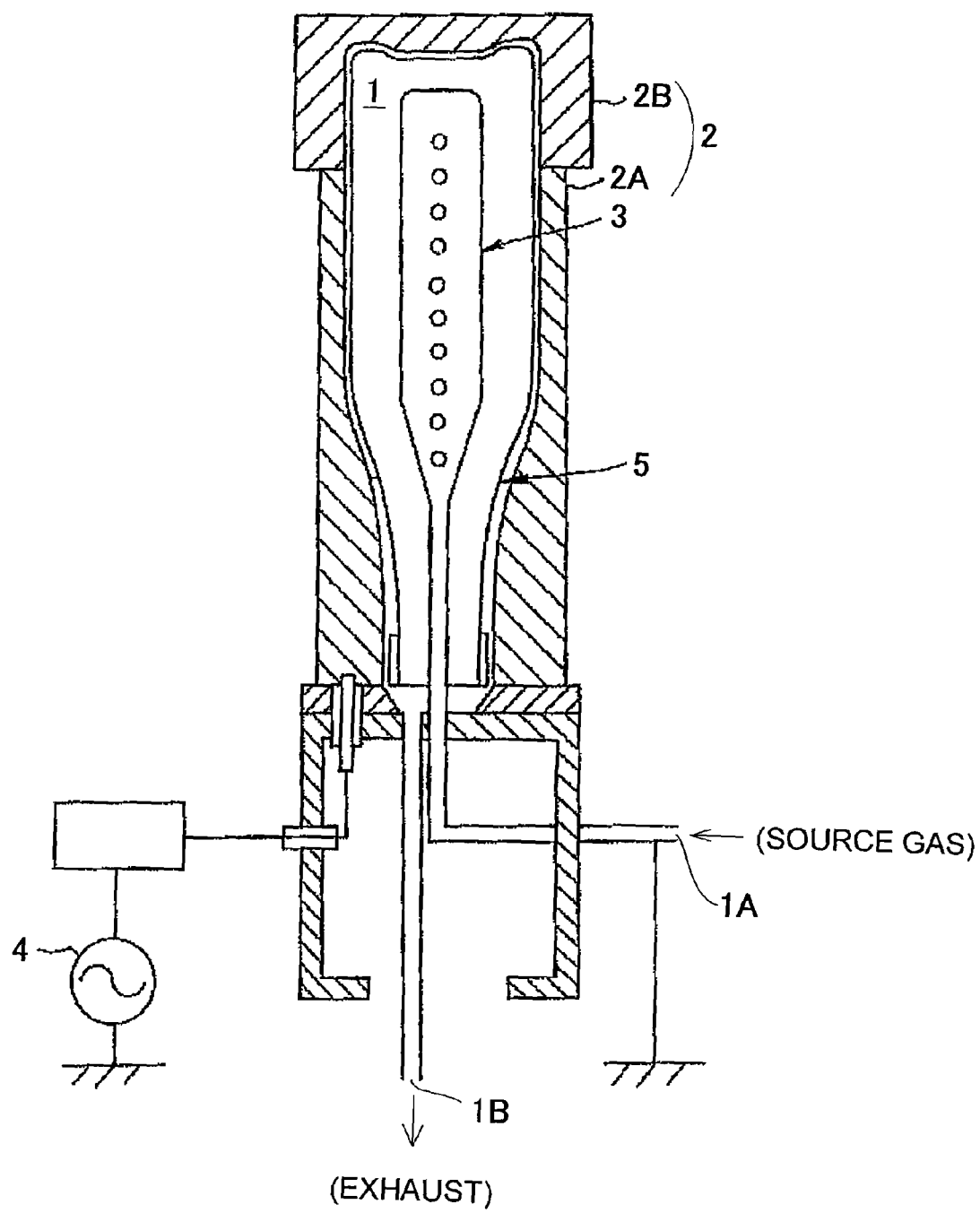
FIG. 9 is a structural drawing of a prior art DLC film forming apparatus.

In the manufacturing apparatus of both the first embodiment and the second embodiment, because the thermal catalyst can decompose the source gas just by passing an electric current, it is possible to form a gas barrier thin film on a large quantity of plastic containers at once if a plurality of thermal catalysts is prepared. FIG. 6 is a conceptual drawing of an apparatus for forming a gas barrier thin film simultaneously on the inner surface of a plurality of plastic containers. In FIG. 6, a large quantity of plastic containers 11 is positioned and lined up inside one lower chamber 13, a thermal catalyst 18 and a source gas supply pipe 23 the same as those of FIG. 1 are inserted into the mouth portion of each plastic container 11, and a gas barrier thin film is formed. Further, FIG. 7 is a conceptual drawing of an apparatus for forming a gas barrier thin film simultaneously on the outer surface of a plurality of plastic containers 11. In FIG. 7, a large quantity of plastic containers 11 is positioned and lined up inside one lower chamber 63, a thermal catalyst 18 is arranged respectively around the periphery of each plastic container 11, and after the source gas from the source gas supply pipe 73 makes contact with the thermal catalyst 18, it is blown on the plastic container 11. Here, the mouth portion is fixed by the bottle rotating mechanism 32, and a thin film is formed on the outer surface while the plastic container 11 is rotated. Further, FIG. 8 is a conceptual drawing of an apparatus for forming a gas barrier thin film simultaneously on the outer surface of a plurality of inline plastic containers 11. In FIG. 8, the plastic containers are moved by a conveyor to a bottle alignment chamber 40, an exhaust chamber 41, a thin film formation chamber 42, a vacuum release chamber 43 and a removal chamber 44 in that order. In the thin film formation chamber 42, the thermal catalyst 18 is arranged along the side wall of the chamber. In the thin film formation chamber 42, the source gas is blown out toward the thermal catalyst 18, the inside of the chamber is filled with chemical species formed by the decomposition of the source gas, and film formation is carried out when the plastic containers 11 pass through the thin film formation chamber 42. In the manufacturing apparatus of both the first embodiment and the second embodiment, it is possible to use the same vacuum chamber even when the shapes of the containers are different, there is no need for a high-frequency power supply, and film formation can be carried out on a plurality of containers inside one vacuum chamber. In this way, the apparatus becomes cheaper than film formation apparatuses that use a high-frequency power source.

In the manufacturing apparatus of both the first embodiment and the second embodiment, from the fact that the plastic container 11 will easily undergo thermal deformation due to the source gas 33 becoming a hot gas, container cooling means are preferably provided. FIG. 11 is a conceptual drawing for describing the container cooling means, wherein (a) is the case where film formation is carried out on the inner surface of the plastic container, and (b) is the case where film formation is carried out on the outer surface of the plastic container. As shown in FIG. 11(a), the manufacturing apparatus of the first embodiment in which the source gas 33 which is a hot gas is blown into the inside of the plastic container 11 preferably has container cooling means 51 which apply a cooled liquid or gas 50 to the outer surface of the plastic containers 11. The container cooling means 51 is a water tank in the case where the plastic containers 11 are immersed in a liquid such as water or the like, and a shower in the case where the plastic containers 11 are showered with a liquid such as water or the like. Further, it is a blower in the case where a gas such as cooled nitrogen gas or cooled carbon dioxide gas or the like is blown on the plastic containers 11. The cooled nitrogen gas and the cooled carbon dioxide gas can be obtained easily by using liquid nitrogen and dry ice, respectively. As shown in FIG. 11(b), the manufacturing apparatus of the second embodiment in which the source gas 33 which is a hot gas is blown toward the outer surface of the plastic container 11 preferably has the container cooling means 51 which apply the cooled liquid or gas 50 to the inner surface of the plastic containers 11. The container cooling means 51 is a liquid filling device in the case where the plastic containers 11 are filled with a liquid such as water or the like, and is a blower in the case where a gas such as cooled nitrogen gas or cooled carbon dioxide gas or the like is blown on the inner surface of the plastic containers 11.

Another embodiment of the thin film formation chamber 42 of FIG. 8 is shown in FIG. 12. The source gas supply pipes 23 and the container cooling means 51 are arranged alternately on the side wall of the thin film formation chamber 42 along the direction of movement of the plastic containers 11. The plastic containers 11 are moved along a conveyor (not shown in the drawings), and are made to rotate. Here, the source gas supply pipe 23 uses the type shown in FIG. 10. The container cooling means 51 uses the type which blows cooled nitrogen gas. When the plastic containers 11 are moved while undergoing rotation by the conveyor, the source gas activated by the thermal catalyst is blown from the source gas supply pipe 23, and then cooled nitrogen gas is blown by the container cooling means 51, and these are carried out alternately. At this time, the formation of a thin film progresses.

Next, with reference to FIG. 1, a method will be described for the case where a hydrogen-containing $SiN_x$ thin film is formed as a gas barrier thin film on the inner surface of the plastic container 11 using the apparatus 100 for manufacturing a gas barrier plastic container. The plastic container 11 is made a round 500 ml PET bottle. The thickness of the container wall is made approximately 0.3 mm. The method of manufacturing a gas barrier plastic container according to the first embodiment is a manufacturing method in which a gas barrier thin film is formed while blowing the source gas 33 in the plastic container 11. Namely, the method of manufacturing a gas barrier plastic container according to the first embodiment has a process in which the inside of the vacuum chamber 6 which houses the plastic container 11 is exhausted to form a pre-set pressure, and a process in which while maintaining a state where electricity is supplied to the thermal catalyst 18 arranged inside the vacuum chamber 6 to generate heat above a pre-set temperature, the source gas 33 is blown on the thermal catalyst 18 to decompose the source gas 33 and create chemical species 34, whereby a gas barrier thin film is formed by the chemical species 34 reaching the inner surface of the plastic container 11.

(Loading Containers in the Plasma CVD Film Forming Apparatus)

First, the vent (not shown in the drawings) is opened to open the inside of the vacuum chamber 6 to the atmosphere. In a state where the upper chamber 15 is removed, the plastic container 11 is inserted from the upper opening of the lower chamber 13 and housed in the reaction chamber 12. Then, the positioned upper chamber 15 is lowered, and the source gas supply pipe 23 and the thermal catalyst 18 fixed thereto provided in the upper chamber 15 are inserted into the inside of the plastic container 11 from the mouth portion 21 of the plastic container. Then, by connecting the upper chamber 15 to the lower chamber 13 via the O-ring 14, the reaction chamber 12 forms a sealed space. At this time, the gap between the inner wall surface of the lower chamber 13 and the outer wall surface of the plastic container 11 is kept roughly uniform, and the gap between the inner wall surface of the plastic container 11 and the thermal catalyst 18 is also kept roughly uniform.

(Pressure Reduction Operation)

Next, after closing the vent (not shown in the drawings), the air inside the reaction chamber 12 is exhausted by operating the exhaust pump (not shown in the drawings) and opening the vacuum valve 8. At this time, not only the space inside the plastic container 11, but also the space between the outer wall surface of the plastic container 11 and the inner wall surface of the lower chamber 13 is exhausted to form a vacuum. Namely, the entire reaction chamber 12 is exhausted. Then the inside of the reaction chamber 12 undergoes pressure reduction until a required pressure, for example, 1~100 Pa is reached. In this regard, if the pressure is less than 1 Pa, exhausting will take too much time, and the cost of thin film formation will increase. Further, if a pressure higher than 100 Pa is preferred, there will be a lot of impurities inside plastic containers 11, and it will not be possible to obtain a container having high barrier properties.

(Supplying Electricity to the Thermal Catalyst and Introduction of the Source Gas)

Next, electricity is supplied to the thermal catalyst 18 to generate heat at a pre-set temperature, for example, 1700° C. Then, a source gas 33 such as ammonia ($NH_3$), silane ($SiH_4$), hydrogen ($H_2$) and the like is supplied to the source gas supply pipe 23 from the gas flow controllers 24a~24c, and the source gas 33 is blown toward the thermal catalyst 18 heated to 1700° C. from the gas blow out hole 17x in the inside of the plastic container 11 which underwent pressure reduction to a pre-set pressure. The supply rate of the source gas is 100 cc/min for ammonia, 3 cc/min for silane, and 50 cc/min for hydrogen gas, for example, and the pressure inside the plastic container 11 is adjusted to 10~30 Pa by this source gas. After the temperature rise of the thermal catalyst 18 above 1600° C. in this way is completed, the blowing of the source gas is preferably begun. From the beginning of film formation, it is possible to create chemical species sufficiently activated by the thermal catalyst 18, and this makes it easy to obtain a film having high gas barrier properties.

(Film Formation)

When the source gas 33 makes contact with the thermal catalyst 18, specific chemical species 34 are created. A pre-set thin film is deposited by this chemical species 34 reaching the inner wall of the plastic container 11. The reaction of monosilane at the surface of the thermal catalyst 18 and the periphery thereof is shown by Equation 1 and Equation 2.

$$SiH_4 \rightarrow Si^* + 4H^* \quad \text{(Equation 1)}$$

$$SiH_4 + H^* \rightarrow SiH_3^* + H_2 \quad \text{(Equation 2)}$$

$SiH_3^*$ is thought to be the main deposition species. Further, the main reaction of ammonia is shown by Equation 3.

$$NH_3 \rightarrow NH_2^* + H^* \quad \text{(Equation 3)}$$

$NH_2^*$ is thought to be the main deposition species. Further, the main reaction of hydrogen is shown by Equation 4.

$$H_2 \rightarrow 2H^* \quad \text{(Equation 4)}$$

$H^*$ is thought to be used for assisting mainly gas phase reactions and surface reactions of the material receiving deposition. $H^*$ is generated even without using hydrogen as a material gas, but by flowing hydrogen gas as a material gas to the reaction chamber 12, it is possible to generate $H^*$ in large quantities, and this exhibits an effect on the acceleration of reactions. Further, $SiH_3^*$ and $NH_3^*$ undergo reactions in accordance with mainly the heat energy of the material receiving deposition, the heat energy of the deposition species, and the presence of reaction-assisting components such as $H^*$ and the like at the surface of the material receiving deposition, and are presumed to form a silicon hydride film as shown by Equation 5. Further, in the description given above, the symbol * indicates a radical state.

$$SiH_3^* + NH_2^* \rightarrow SiN_x \quad \text{(Equation 5)}$$

In the present manufacturing method, in the chemical reaction shown by Equation 5, hydrogen at a pre-set atomic concentration is taken up by $SiN_x$, and a hydrogen-containing $SiN_x$ thin film is formed.

In the catalytic chemical vapor deposition method, the adhesion between the plastic container 11 and the gas barrier thin film is very good. When hydrogen gas is introduced from the source gas channel 17, the hydrogen gas is activated by a catalytic decomposition reaction with the thermal catalyst 18, and cleaning can be carried out by using this activated species to remove the natural oxidation film of the surface of the plastic container 11. Namely, activated hydrogen $H^*$ reacts with O (oxygen) of the plastic container 11 surface, and pulls off the O (oxygen). Further, O (oxygen) and $H^*$ react to form $H_2O$, and cleaning is carried out by exhausting this from the reaction chamber 12 via the exhaust pipe 22.

When $NH_3$ gas is introduced from the source gas channel 17, a surface process is carried out in which the surface of the plastic container 11 is reformed and stabilized by the activated species created by a catalytic decomposition reaction with the thermal catalyst 18. Namely, when activated $NH_2^*$ reaches the surface of the plastic container 11 in the same way, reactions with O (oxygen) of the surface of the plastic container 11 occur, and cleaning is carried out.

(Completion of Film Formation)

When the thin film reaches a pre-set thickness, the supply of the source gas 33 is stopped, and after the inside of the reaction chamber 12 is exhausted again, a leak gas not shown in the drawings is introduced, and the reaction chamber 12 is set at atmospheric pressure. Then, the upper chamber 15 is opened, and the plastic container 11 is removed. The film thickness of the thin film depends on the type of thermal catalyst 18, the pressure of the source gas inside the plastic container 11, the source gas flow rate, the amount of time the source gas is blown on the thermal catalyst 18, the type of source gas and the like, but it was understood that 5~100 nm is preferred in order to optimize compatibility of the sorption control effect of low molecular weight compounds and the improvement effect of the gas barrier properties, the adhesion with the plastic container, the durability and the transparency and the like. Further, it was understood that the value of the hydrogen content of the obtained hydrogen-containing $SiN_x$ thin film measured by RBS (Rutherford Backscattering Spectrometry) preferably has a hydrogen content ratio of 1~10 atomic %. At this time, the oxygen permeability of the container was measured, and the oxygen permeability was 0.0010 cc/container/day. Further, the evaluation method is as follows.

(Evaluation Method)

(1) Oxygen Permeability

The oxygen permeability of this container was measured under the conditions 23° C. and 90% RH using an Oxtran 2/20 manufactured by Modern Control Company, and the measurement value after 20 hours from the beginning of nitrogen gas replacement was recorded.

(2) Film Thickness

The thickness of the DLC film was measured using a DEK-TAK3 manufactured by ULVAC TECHNO (Ltd.).

It was understood that if the film thickness of the hydrogen-containing $SiN_x$ thin film is less than 5 nm, the oxygen permeability will become high and the gas barrier properties will be lowered, and if it exceeds 100 nm, it will be easy for cracks to enter the film. Further, it was understood that if the hydrogen content ratio of the hydrogen-containing $SiN_x$ thin film is less than 1 atomic %, the film will become hard and easily form cracks, and will become brittle. It was understood that if the hydrogen content ratio exceeds 10 atomic %, the oxygen permeability will become high and the gas barrier properties will be lowered. From those facts, in the plastic container which has gas barrier properties, a hydrogen-containing $SiN_x$ thin film is formed as a gas barrier thin film on the surface of the plastic container, and the hydrogen-containing $SiN_x$ thin film has a film thickness of 5~100 nm, and preferably 10~50 nm, and a hydrogen content ratio of 1~10 atomic %, and preferably 3~6 atomic %. Further, this plastic container which has gas barrier properties can completely control the sorption of low molecular weight compounds such as odor components and the like, can be used as a packaging container for broad fields, and can be used as a returnable container. Moreover, in the case where the thin film is formed on the inner surface of the plastic container, there is no risk that the formed thin film will be damaged during the handling of the plastic container. Further, by forming a thin film, there is no loss of transparency possessed by the plastic container.

Next, with reference to FIG. 3, a method will be described for the case where a hydrogen-containing $SiN_x$ thin film is formed as a gas barrier thin film on the outer surface of the plastic container 11 using the apparatus 300 for manufacturing a gas barrier plastic container. The plastic container 11 is made a round 500 ml PET bottle. The thickness of the container wall is made approximately 0.3 mm. The method of manufacturing a gas barrier plastic container according to the second embodiment is a manufacturing method in which a gas barrier thin film is formed while blowing the source gas 33 on the plastic container 11. Namely, the method of manufacturing a gas barrier plastic container according to the second embodiment has a process in which the inside of the vacuum chamber 60 which houses the plastic container 11 is exhausted to form a pre-set pressure, and a process in which while maintaining a state where electricity is supplied to the thermal catalyst 18 arranged inside the vacuum chamber 60 to generate heat above a pre-set temperature, the source gas 33 is blown on the thermal catalyst 18 to decompose the source gas 33 and create the chemical species 34, whereby a gas barrier thin film is formed by the chemical species 34 reaching the outer surface of the plastic container 11.

(Loading Containers in the Plasma CVD Film Forming Apparatus)

First, the vent (not shown in the drawings) is opened to open the inside of the vacuum chamber 60 to the atmosphere. In a state where the upper chamber 65 is removed, the mouth portion of the plastic container 11 is inserted in the bottle rotating mechanism 32 in the reaction chamber 12. Then, the positioned upper chamber 65 is lowered toward the lower chamber 63, and the gas blow out hole 77*x* of the source gas supply pipe 73 provided in the lower chamber 63 faces the outer surface of the plastic container 11. At the same time, the thermal catalyst 18 is arranged on the periphery of the plastic container 11. Then, by connecting the upper chamber 65 to the lower chamber 63 via the O-ring 14, the reaction chamber 12 forms a sealed space. At this time, the gap between the inner wall surface of the lower chamber 63 and the outer wall surface of the plastic container 11 is kept roughly uniform, and the gap between the outer wall surface of the plastic container 11 and the thermal catalyst 18 is also kept roughly uniform.

(Pressure Reduction Operation)

Next, after closing the vent (not shown in the drawings), the air inside the reaction chamber 12 is exhausted by operating the exhaust pump (not shown in the drawings) and opening the vacuum valve 8. At this time, both the space inside and the space outside the plastic container 11 are exhausted to form a vacuum. Namely, the entire reaction chamber 12 is exhausted. Then the inside of the reaction chamber 12 undergoes pressure reduction until a required pressure, for example, 1~100 Pa is reached. The reason for forming this pressure range is the same as the reason explained in the method of manufacturing a gas barrier plastic container according to the first embodiment.

(Supplying Electricity to the Thermal Catalyst and Introduction of the Source Gas)

Next, electricity is supplied to the thermal catalyst 18 to generate heat at a pre-set temperature of 1700° C., for example. Then, a source gas 33 such as ammonia ($NH_3$), silane ($SiH_4$), hydrogen ($H_2$) and the like is supplied to the source gas supply pipe 73 from the gas flow controllers 24*a*~24*c*, and the source gas 33 is blown toward the thermal catalyst 18 heated to 1700° C. from the gas blow out hole 77*x* in the inside of the plastic container 11 which underwent pressure reduction to a pre-set pressure. The supply rate of the source gas is the same as the case described in the method of manufacturing a gas barrier plastic container according to the first embodiment. The pressure inside the reaction chamber 12 is adjusted to 10~30 Pa by this source gas. After the temperature rise of the thermal catalyst 18 above 1600° C. in this way is completed, the blowing of the source gas is preferably begun.

(Film Formation)

In the same way as the case described in the method of manufacturing a gas barrier plastic container according to the first embodiment, when the source gas 33 makes contact with the thermal catalyst 18, the specific chemical species 34 are created, and a hydrogen-containing $SiN_x$ thin film is formed on the outer surface of the plastic container 11. Here too, the adhesion between the plastic container 11 and the gas barrier thin film is very good.

(Completion of Film Formation)

When the thin film reaches a pre-set thickness, the supply of the source gas 33 is stopped, and after the inside of the reaction chamber 12 is exhausted again, a leak gas not shown in the drawings is introduced, and the reaction chamber 12 is set at atmospheric pressure. Then, the upper chamber 65 is opened, and the plastic container 11 is removed. Here, it was understood that the film thickness is preferably formed to be 5~100 nm. Further, it was understood that the value of the hydrogen content of the obtained hydrogen-containing $SiN_x$ thin film measured by RBS (Rutherford Backscattering Spectrometry) preferably has a hydrogen content ratio of 1~10 atomic %. At this time, the oxygen permeability of the container was measured, and the oxygen permeability was 0.0010 cc/container/day. Namely, in the plastic container which has gas barrier properties obtained by the manufacturing method of the second embodiment, a hydrogen-containing $SiN_x$ thin film is formed as a gas barrier thin film on the outer surface of the plastic container, and the hydrogen-containing $SiN_x$ thin film has a film thickness of 5~100 nm and a hydrogen content ratio of 1~10 atomic %.

Next, with reference to FIG. 2, a description will be given for the method of manufacturing a gas barrier plastic container according to the third embodiment in which a hydrogen-containing $SiN_x$ thin film is formed by filling the reaction chamber 12 with the source gas using the apparatus 200 for manufacturing a gas barrier plastic container. Namely, the method of manufacturing a gas barrier plastic container according to the third embodiment has a process in which after at least the space inside the plastic container 11 housed in the reaction chamber 12 is filled with the source gas 33 under a pre-set pressure, the supply of the source gas 33 is stopped to stop the flowing in and out of gas in the reaction chamber 12, and a process in which while maintaining a state where electricity is supplied to the thermal catalyst 18 to generate heat above a pre-set temperature, the thermal catalyst 18 is guided into the space filled with the source gas 33 to decompose the source gas 33 and create the chemical species 34, whereby a gas barrier thin film is formed by the chemical species 34 reaching the inner surface of the plastic container 11.

Further, in FIG. 12, the manufacturing method of the case that uses the source gas supply pipe of FIG. 10 was described at the place where FIG. 12 was shown, but this manufacturing method is another embodiment of the method of manufacturing a gas barrier plastic container according to the second embodiment.

(Loading Containers in the Plasma CVD Film Forming Apparatus)

First, the vent (not shown in the drawings) is opened to open the inside of the vacuum chamber 6 to the atmosphere. In a state where the upper chamber 15 is removed, the plastic container 11 is inserted from the upper opening of the lower chamber 13 and housed in the reaction chamber 12. Then, the positioned upper chamber 15 is lowered, and the source gas supply pipe 23 and the thermal catalyst 18 housed in the inside thereof provided in the upper chamber 15 are inserted into the inside of the plastic container 11 from the mouth portion 21 of the plastic container. Then, by connecting the upper chamber 15 to the lower chamber 13 via the O-ring 14, the reaction chamber 12 forms a sealed space. At this time, the gap between the inner wall surface of the lower chamber 13 and the outer wall surface of the plastic container 11 is kept roughly uniform, and the gap between the inner wall surface of the plastic container 11 and the thermal catalyst 18 is also kept roughly uniform.

(Pressure Reduction Operation)

Next, after closing the vent (not shown in the drawings), the air inside the reaction chamber 12 is exhausted by operating the exhaust pump (not shown in the drawings) and opening the vacuum valve 8. At this time, not only the space inside the plastic container 11, but also the space between the outer wall surface of the plastic container 11 and the inner wall surface of the lower chamber 13 is exhausted to form a vacuum. Then the inside of the reaction chamber 12 undergoes pressure reduction until a required pressure of 1~5 Pa, for example, is reached.

(Supplying Electricity to the Thermal Catalyst and Introduction of the Source Gas)

Next, electricity is supplied to the thermal catalyst 18 to generate heat at a pre-set temperature of 1600~2000° C., for example. Then, a main valve not shown in the drawings is closed and a fixed amount of the source gas 33 is blown out from the source gas supply pipe 23. At this time, within the source gas 33, $NH_3$ (represented by the symbol 33a) passes through the source gas channel 17a of the inner pipe of the triple pipe and is blown out from the tip thereof, and $SiH_4$ and $H_2$ (both represented by the symbol 33b) are blown out from the source gas channel 17b of the outer pipe of the triple pipe. In this way, the inside of the plastic container 11 is filled with a pre-set amount of the source gas 33. Then, the valves 25e and 25f are closed. Further, the valve 8 is closed. In this way, at least the space inside the plastic container 11 housed in the reaction chamber 12 is filled with the source gas 33 under a pre-set pressure, and the flowing in and out of gas in the reaction chamber 12 is stopped.

(Film Formation)

Then, the thermal catalyst 18 arranged inside the source gas channel 17a is inserted into the reaction chamber 12 by extending the inner pipe 36 made from an insulating ceramic equipped with the telescoping mechanism. At this time, the silane gas which is the source gas filled in the reaction chamber 12 is decomposed, and a hydrogen-containing $SiN_x$ thin film is formed on the inner surface of the container by the reaction process described above. The formation of the thin film is completed as soon as all of the source gas 33 is decomposed. Because the thickness of formed thin film is determined by the amount of purged source gas 33 in the reaction chamber 12, it becomes easy to control the thickness of the formed thin film. In the case of a hydrogen-containing $SiN_x$ thin film, the required amount of the source gas 33 sealed in a 500 ml bottle is 0.9~18.5 cc for $SiH_4$, and the proportion of $SiH_4$ and the other source gases is $SiH_4:NH_3:H_2=1:16.7:33.3$. In the method of manufacturing a gas barrier plastic container according to the third embodiment, a hydrogen-containing $SiN_x$ thin film is formed as a gas barrier thin film on the inner surface of the plastic container in the same way as in the manufacturing method of the first embodiment, whereby a container is obtained in which the hydrogen-containing $SiN_x$ thin film has a film thickness of 5~100 nm and a hydrogen content ratio of 1~10 atomic %.

Further, there is an embodiment of a manufacturing method in which the source gas supply pipe 73 of the apparatus 300 for manufacturing a gas barrier plastic container of FIG. 3 is given the same structure as the source gas supply pipe 23 of FIG. 2. Namely, in of the apparatus 300 for manufacturing a gas barrier plastic container of FIG. 3, if a housing mechanism for housing the thermal catalyst 18 inside the source gas supply pipe (the type of FIG. 2) is provided, it is possible to form a hydrogen-containing $SiN_x$ thin film on the outer surface of the container by filling the reaction chamber 12 with the source gas 33. Namely, the method of manufacturing a gas barrier plastic container according to the fourth embodiment has a process in which after at least the space outside the plastic container 11 housed in the reaction chamber 12 is filled with the source gas 33 under a pre-set pressure, the supply of the source gas 33 is stopped to stop the flowing in and out of gas in the reaction chamber 12, and a process in which while maintaining a state where electricity is supplied to the thermal catalyst 18 to generate heat above a pre-set temperature, the thermal catalyst 18 is guided into the space filled with the source gas 33 to decompose the source gas 33 and create the chemical species 34, whereby a gas barrier thin film is formed by the chemical species 34 reaching the outer surface of the plastic container 11. Hereafter, a description will be given assuming a manufacturing apparatus in which the source gas supply pipe 73 in the apparatus 300 for manufacturing a gas barrier of FIG. 3 plastic container is replaced with the source gas supply pipe 23 of FIG. 2.

(Loading Containers in the Plasma CVD Film Forming Apparatus)

First, the vent (not shown in the drawings) is opened to open the inside of the vacuum chamber 60 to the atmosphere. In a state where the upper chamber 65 is removed, the mouth portion of the plastic container 11 is inserted in the bottle rotating mechanism 32 in the reaction chamber 12. Then, the positioned upper chamber 65 is lowered toward the lower chamber 63, and the source gas supply pipe (the type of FIG. 2) and the thermal catalyst 18 fixed thereto provided in the lower chamber 63 are arranged on the periphery of the plastic container 11. Then, by connecting the upper chamber 65 to the lower chamber 63 via the O-ring 14, the reaction chamber 12 forms a sealed space. At this time, the gap between the inner wall surface of the lower chamber 63 and the outer wall surface of the plastic container 11 is kept roughly uniform, and the gap between the outer wall surface of the plastic container 11 and the thermal catalyst 18 is also kept roughly uniform.

(Pressure Reduction Operation)

Next, after closing the vent (not shown in the drawings), the air inside the reaction chamber 12 is exhausted by operating the exhaust pump (not shown in the drawings) and opening the vacuum valve 8. At this time, not only the space outside the plastic container 11, but also the space between the outer wall surface of the plastic container 11 and the inner wall surface of the lower chamber 63 is exhausted to form a vacuum. Then the inside of the reaction chamber 12 undergoes pressure reduction until a required pressure of 1~5 Pa, for example, is reached.

(Supplying Electricity to the Thermal Catalyst and Introduction of the Source Gas)

Next, electricity is supplied to the thermal catalyst 18 to generate heat at a pre-set temperature of 1600~2000° C., for example. Then, a main valve not shown in the drawings is closed and a fixed amount of the source gas 33 is blown out from the source gas supply pipe (the type of FIG. 2). At this time, within the source gas 33, $NH_3$ passes through the source gas channel of the inner pipe of the triple pipe and is blown out from the tip thereof, and $SiH_4$ and $H_2$ are blown out from the source gas channel of the outer pipe of the triple pipe. In this way, the inside of the plastic container 11 is filled with a pre-set amount of the source gas 33. Then, the valve 25d is closed. Further, the valve 8 is closed. In this way, at least the space outside the plastic container 11 housed in the reaction chamber 12 is filled with the source gas 33 under a pre-set pressure, and the flowing in and out of gas in the reaction chamber 12 is stopped.

(Film Formation)

Then, the thermal catalyst 18 arranged inside the source gas channel 17a is inserted into the reaction chamber 12 by extending the inner pipe (the type of symbol 36 of FIG. 2) made from an insulating ceramic equipped with the telescoping mechanism. At this time, the silane gas which is the source gas filled inside the reaction chamber 12 is decomposed, and a hydrogen-containing $SiN_x$ thin film is formed on the outer surface of the plastic container 11 by the reaction process described above. The formation of the thin film is completed as soon as all of the source gas 33 is decomposed. In the method of manufacturing a gas barrier plastic container according to the fourth embodiment, a hydrogen-containing $SiN_x$ thin film is formed as a gas barrier thin film on the outer surface of the plastic container in the same way as in the manufacturing method of the second embodiment, whereby a container is obtained in which the hydrogen-containing $SiN_x$ thin film has a film thickness of 5~100 nm and a hydrogen content ratio of 1~10 atomic %.

In the present invention, it is also possible to form a hydrogen-containing $SiN_x$ thin film by the same method in a square-shaped 500 ml PET bottle. Further, by changing the source gas, it is possible to form a hydrogen-containing DLC thin film, a hydrogen-containing $SiO_x$ thin film or a hydrogen-containing $SiC_xN_y$ thin film by the same method.

In the embodiments, descriptions were given in which the gas barrier thin film is formed on one of either the outer surface or the inner surface of the plastic container, but these can be combined, and a gas barrier thin film may be formed on the outer surface and the inner surface of the plastic container.

INDUSTRIAL APPLICATION

The gas barrier plastic container according to the present invention is a beverage plastic container having oxygen gas and carbon dioxide gas barrier properties which is suited to alcoholic beverages such as beer and the like or soft drinks and the like.

The invention claimed is:

1. An apparatus for manufacturing a gas barrier plastic container, comprising:
    a vacuum chamber for housing a plastic container;
    an exhaust pump which evacuates said vacuum chamber;
    a source gas supply pipe formed from an insulating and heat-resistant material which is arranged to be insertable into and removable from the inside of said plastic container to supply a source gas to the inside of said plastic container, wherein the source gas supply pipe has at least a gas blow out hole at one end through which the source gas is blown out; and
    a heater power supply which supplies electricity to a thermal catalyst to generate heat characterized in that the thermal catalyst is supported on said source gas supply pipe;
    wherein the thermal catalyst is a wire, wherein the wire is in front of the gas blow out hole and generates a thermal catalytic reaction.

2. The apparatus for manufacturing a gas barrier plastic container according to claim 1, wherein said source gas supply pipe has an integrally formed cooling pipe for cooling said source gas supply pipe.

3. The apparatus for manufacturing a gas barrier plastic container according to claim 1, wherein said source gas supply pipe is a ceramic pipe formed from a material in which aluminum nitride, silicon carbide, silicon nitride or aluminum oxide forms the main component, or a metal pipe whose surface is coated with a material in which aluminum nitride, silicon carbide, silicon nitride or aluminum oxide forms the main component.

4. The apparatus for manufacturing a gas barrier plastic container according to claim 1, wherein the distance from said gas blow out hole to the bottom of said plastic container has a length of 5~30 mm.

5. The apparatus for manufacturing a gas barrier plastic container according to claim 1, wherein said thermal catalyst is arranged so that the upper end thereof is positioned 10~30 mm below from the lower end of the mouth portion of said plastic container.

6. The apparatus for manufacturing a gas barrier plastic container according to claim 1, wherein the inner surface of said vacuum chamber is colored black or the inner surface has a surface roughness (Rmax) of 0.5 μm or higher, and cooling means are provided in the inside or the outside of the chamber.

7. The apparatus for manufacturing a gas barrier plastic container according to claim 6, wherein the inner surface of said vacuum chamber is colored black.

8. The apparatus for manufacturing a gas barrier plastic container according to claim 1, further comprising container cooling means which apply a cooled liquid or gas to the outer surface of said plastic container.

* * * * *